US011098247B2

(12) United States Patent
Lüchinger et al.

(10) Patent No.: US 11,098,247 B2
(45) Date of Patent: *Aug. 24, 2021

(54) SOLID POLYMER COMPOSITION

(71) Applicant: AVANTAMA AG, Stäfa (CH)

(72) Inventors: Norman Lüchinger, Meilen (CH); Marek Oszajca, Zürich (CH); Patrick Kissel, Herrliberg (CH); Maksym Kovalenko, Zürich (CH); Loredana Protesescu, Dorchester, MA (US); Franziska Krieg, Wädenswil (CH); Sylwia Nowakowska, Meilen (CH)

(73) Assignee: Avantama AG, Stäfa (CH)

( * ) Notice: Subject to any disclaimer, the term of this patent is extended or adjusted under 35 U.S.C. 154(b) by 163 days.

This patent is subject to a terminal disclaimer.

(21) Appl. No.: 16/318,733

(22) PCT Filed: Jun. 26, 2017

(86) PCT No.: PCT/EP2017/065720
§ 371 (c)(1),
(2) Date: Jan. 18, 2019

(87) PCT Pub. No.: WO2018/028870
PCT Pub. Date: Feb. 15, 2018

(65) Prior Publication Data
US 2019/0153313 A1 May 23, 2019

(30) Foreign Application Priority Data
Aug. 11, 2016 (EP) .................................... 16183786

(51) Int. Cl.
C09K 11/66 (2006.01)
H01L 51/50 (2006.01)
H01L 33/50 (2010.01)
C09K 11/02 (2006.01)
H01L 27/32 (2006.01)
B82Y 20/00 (2011.01)
C08L 23/06 (2006.01)
C08L 27/08 (2006.01)

(52) U.S. Cl.
CPC ............ C09K 11/665 (2013.01); C09K 11/02 (2013.01); C09K 11/664 (2013.01); H01L 33/502 (2013.01); H01L 51/502 (2013.01); B82Y 20/00 (2013.01); C08L 23/06 (2013.01); C08L 27/08 (2013.01); H01L 27/3211 (2013.01); H01L 51/504 (2013.01); H01L 51/5044 (2013.01)

(58) Field of Classification Search
CPC ..... C09K 11/665; C09K 11/664; C09K 11/02; H01L 33/502
See application file for complete search history.

(56) References Cited

U.S. PATENT DOCUMENTS

| | | | | |
|---|---|---|---|---|
| 8,926,163 B2 * | 1/2015 | Su | .......................... | G02F 1/1335 |
| | | | | 362/633 |
| 8,926,778 B2 * | 1/2015 | Namkung | .............. | H05B 33/10 |
| | | | | 156/247 |
| 10,424,696 B2 * | 9/2019 | Lee | ........................ | C09K 11/06 |
| 2015/0034875 A1 | 2/2015 | Kwon et al. | | |
| 2016/0161066 A1 | 6/2016 | Sung | | |

FOREIGN PATENT DOCUMENTS

| | | | |
|---|---|---|---|
| EP | 0320264 A2 | 6/1989 | |
| JP | 2014127286 A | 7/2014 | |
| WO | 2011/053635 A1 | 5/2011 | |
| WO | WO 2011/053635 | * | 5/2011 |
| WO | 2013078252 A1 | 5/2013 | |
| WO | 2015132673 A | 9/2015 | |
| WO | 2016/083783 A1 | 6/2016 | |
| WO | WO 2016/072803 | * | 12/2016 |

OTHER PUBLICATIONS

International Search Report for corresponding International Application No. PCT/EP2017/065720 dated Aug. 31, 2017.
Written Opinion of the International Searching Authority for corresponding International Application No. PCT/EP2017/065720 dated Aug. 31, 2017.
Ling et al., "Bright Light-Emitting Diodes Based on Organometal Halide Perovskite Nanoplatelets", Advanced Materials, vol. 28, No. 2, Jan. 1, 2016, pp. 305-311 (cited in specification on p. 2).
Masi et al., "Multiscale morphology design of hybrid halide perovskites thorugh a polymeric template", Nanoscale, vol. 7, No. 45, Jan. 1, 2015, pp. 18956-18963.
Ayguler et al., "Light-Emitting Electrochemical Cells Based on Hybrid Lead Halide Perovskite Nanoparticles", The Journal of Physical Chemistry C, vol. 119, No. 21, May 8, 2015, pp. 12047-1054 (cited in specification on p. 1).
Li et al., "Stabilizing Perovskite Structures by Tuning Tolerance Factor: Formation of Formamidinium and Cesium Lead Iodide Solid-State Alloys", Chemistry of Materials, vol. 28, 2015, pp. 284-292 (cited in specification on p. 1).
Protesescu et al., "Nanocrystals of Cesium Lead Halide Perovskites (CsPbX3, X = Cl, Br, and I): Novel Optoelectronic Materials Showing Bright Emission with Wide Color Gamut", Nano Letters, vol. 15, 2015, pp. 3692-3696 (cited in specification on p. 1).

(Continued)

Primary Examiner — C Melissa Koslow
(74) Attorney, Agent, or Firm — Renner, Otto, Boissele & Sklar, LLP

(57) ABSTRACT

The present invention relates in a first aspect to a solid polymer component comprising luminescent crystals of 3-500 nm size, surfactant and a hardened/cured polymer. In a second aspect of the invention, a luminescent component comprises a first element comprising the solid polymer component according to the first aspect and an encapsulation enclosing the first element. In a third aspect of the invention, a luminescent component comprises a first film comprising the solid polymer composition of the first aspect. A fourth aspect of the invention relates to a light emitting device comprising the luminescent component according to the second or third aspect of the invention and a light source.

31 Claims, 11 Drawing Sheets

(56) References Cited

OTHER PUBLICATIONS

Office Action of KIPO for corresponding Korean Patent Application No. 10-2019-7000751, dated Feb. 22, 2019.
Zhang et al., "Brightly Luminescent and Color-Tunable Colloidal $CH_3NH_3PbX_3$ (X=Br, I, Cl) Quantum Dots: Potential Alternatives for DisplayTechnology", ACS Nano (2015), vol. 9, No. 4, 4533-4542.
Pathak et al., "Perovskite Crystals for Tunable White Light Emission", Chem. Mater. 2015, 27, 8066-8075.
Tadros, T. F. (2015). Interfacial phenomena and colloid stability: Basic principles, vol. 1, De Gruyter, ISBN978-3-11-028340-2.
Wikipedia, item: Surfactant (Jan. 10, 2016); https://en.wikipedia.org/w/index.php?title=Surfactant&oldid=699208666#Classification_of_surfactants.
Green et al., "The emergence of perovskite solar cells", Nature Photonics, vol. 8, Jul. 2014, p. 506-514.
McMeekin et al., "A mixed-cation lead mixed-halide perovskite absorber for tandem solar cells," Science, Jan. 8, 2016, vol. 351, Issue 6269, p. 151-155.
De Roo et al., "Highly Dynamic Ligand Binding and Light Absorption Coefficient of Cesium Lead Bromide Perovskite Nanocrystals", ACS Nano 2016, 10, 2071-2081.

\* cited by examiner

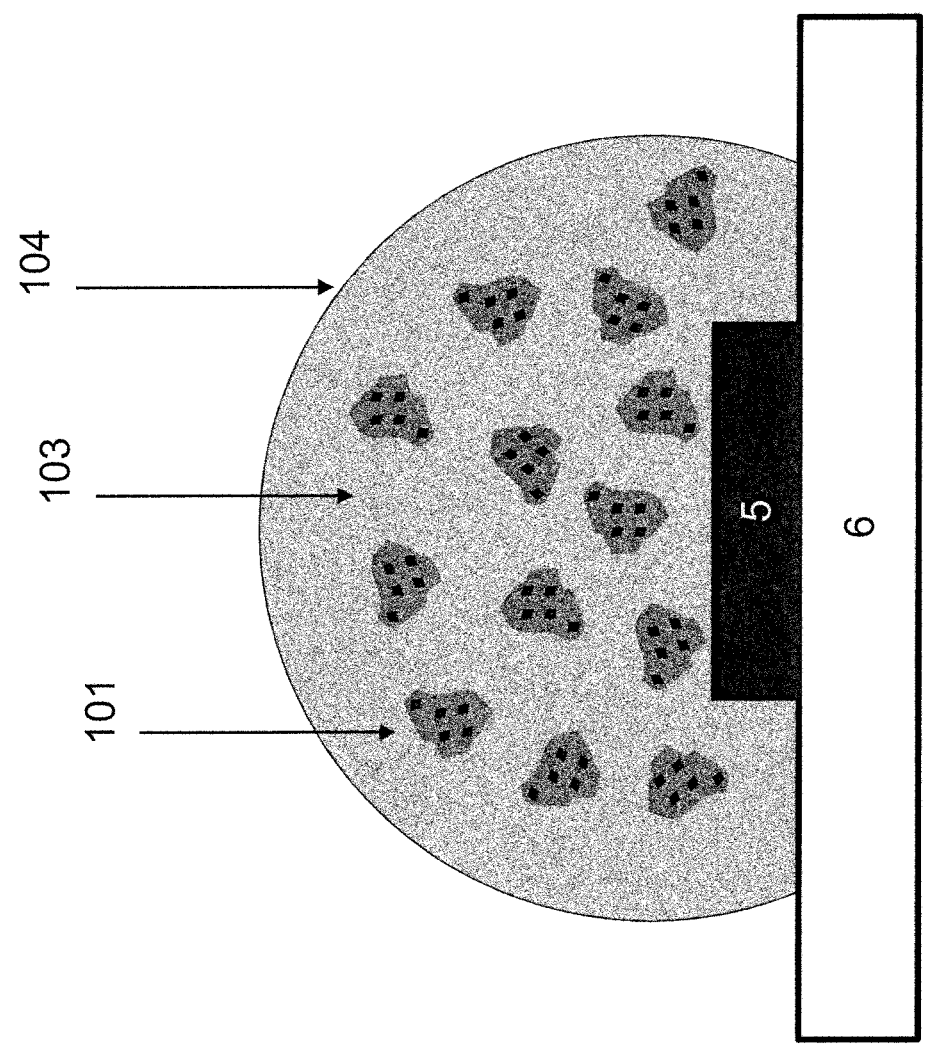

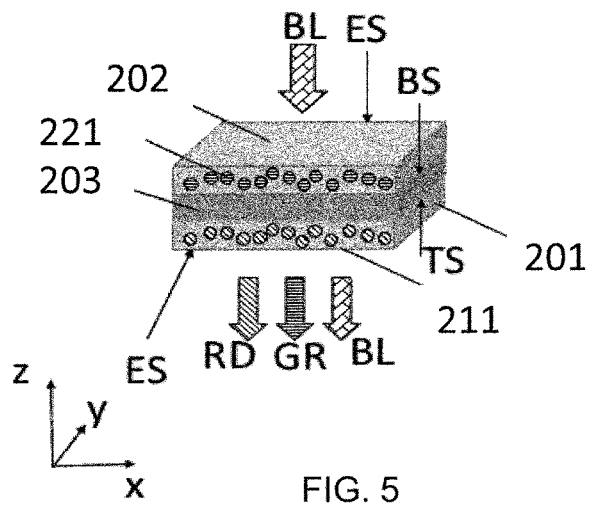
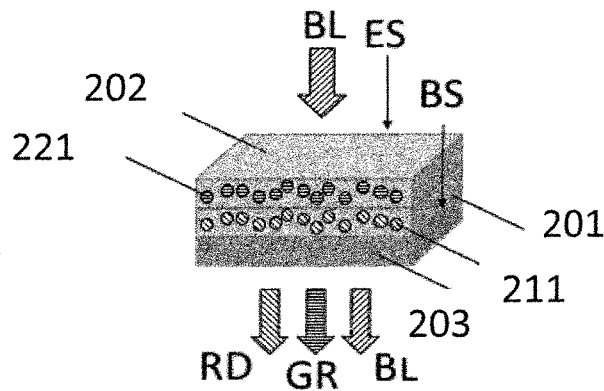
FIG. 5
FIG. 6
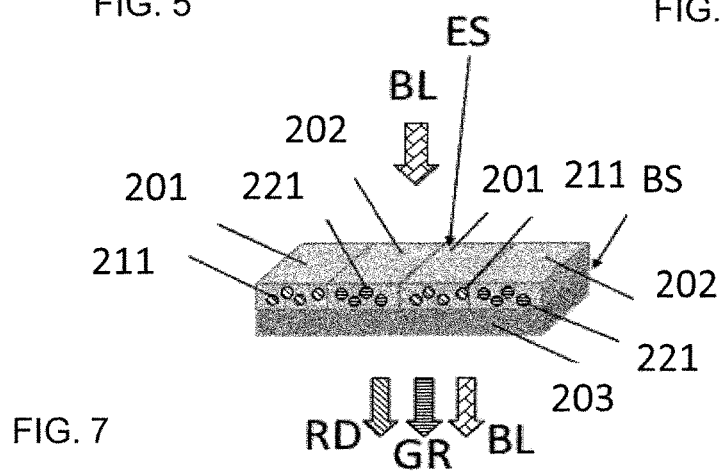
FIG. 7
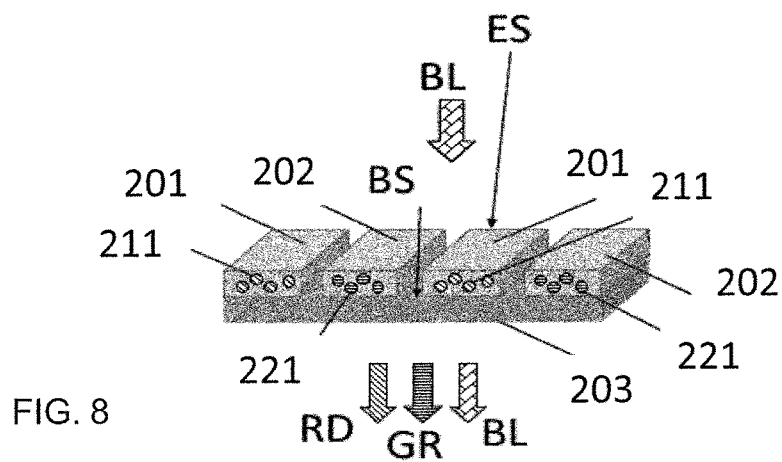
FIG. 8

SOLID POLYMER COMPOSITION

This application is a national phase of International Application No. PCT/EP2017/065720 filed Jun. 26, 2017 and published in the English language, which claims priority to European Application No. 16183786.9 filed Aug. 11, 2016, which is incorporated herein by reference.

TECHNICAL FIELD

The present invention relates to a solid polymer composition comprising luminescent crystals, luminescent components comprising the solid polymer composition, and a light emitting device comprising one of the luminescent components.

BACKGROUND ART

Luminescent crystals, specifically quantum dots, are a known class of materials. Integrating these luminescent crystals into a composite makes them applicable for electronic devices in general and in particular makes them applicable for light emitting devices or cells. Such light emitting devices or cells find applications in various fields, in particular in display technologies, such as liquid crystal displays or light-emitting diodes or organic-light-emitting diodes.

Aygüler et al (J. Phys. Chem. C 2015, 119, 12047-12054) disclose light emitting electrochemical cells based on hybrid lead halide perovskite nanoparticles. The authors disclose a method for manufacturing such nanoparticles of 50-90 nm.

Li et al (Chem. Mater., 2015, 284-292) describe the formation of $(FA,Cs)PbI_3$ solid state alloys in bulk film form to stabilize Perovskite Structures, where FA represents formamidinium. The materials disclosed in that document do not show luminescence. The formation of the films is obtained via solution in N,N-dimethylformamide.

Protesescu, L. et al. (Nano Lett., 2015, 15, 3692-3696) disclose a new class of luminescent quantum dots (QDs) of high quality. The authors disclose the fabrication of a composite comprising CsPb nanocrystals (NC) which were integrated into PMMA, for their usability for light-emitting applications. However, such NC-PMMA composites suffer from thermal instability at increasing temperatures which makes them not very favorable for their application in light emitting devices, in particular display devices, or luminescent composites respectively, which in particular might heat up when excited by a background lighting.

Ling et al (Adv. Mater., 28, 2016, 305-311) disclose bright LEDs based on $MAPBBr_3$ perovskite nanoplatelets in a PVK:PBD matrix, where the nanoplatelets comprise a capping agent.

Dubrow et al (WO2011/053635) disclose LED devices comprising nanocrystals dispersed in a polymeric material to thereby hermetically seal said nanocrystals.

Kwon et al (US2015/0034875) disclose LED devices comprising multiple polymer matrix layers comprising quantum dots.

DISCLOSURE OF THE INVENTION

The problem to be solved by the present invention is therefore to overcome the disadvantages of the prior art.

This problem is solved by the subjects of the independent claims concerning a first, second, third and fourth aspect of the invention.

Unless otherwise stated, the following definitions shall apply in this specification:

The terms "a", "an," "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Percentages are given as weight-%, unless otherwise indicated herein or clearly contradicted by the context.

The term "perovskite" is known in the field and denotes ternary minerals having the perovskite-type crystal structure. Its structure is $ABX_3$ where A and B are cations, A having coordination number 12 and B having coordination umber 6. X are anions forming a cubic or distorted cubic (e.g. orthorhombic). The term shall also include structures derived from perovskites, such as the Elpasolithes $[A_{0.5}A'_{0.5}]BX_3$.

The terms "surfactant", "ligand" and "dispersant" are known in the field and have essentially the same meaning. In the context of the present invention, these terms denote an organic substance, other than a solvent, which is used in suspensions or colloids to improve the separation of particles and to prevent agglomeration or settling. The term "surfactant" particularly relates to compounds that lower the surface tension between two liquids or between a liquid and a solid. In the context of this invention, surfactants are organic compounds selected from the group of non-ionic, anionic, cationic, zwitter-ionic surfactants. Without being bound to theory, it is believed that surfactants are physically or chemically attached on the particle surface either before or after adding the particles to the solvent and thereby provide the desired effects. In the context of the present invention, solvents (e.g. toluene) are not considered surfactants.

The term "solvent" is known in the field and particularly includes aliphatic hydrocarbons, aromatic hydrocarbons, ethers (including glycol-ethers), esters, alcohols, ketones, amines, amides, sulfones, phosphines, alkylcarbonates. The above organics can be substituted or unsubstituted by one or more substituents, for example by halogen (such as fluoro), Hydroxy, C1-4 alkoxy (such as methoxy or ethoxy) and alkyl (such as methyl, ethyl, iso-propyl). The above organics include linear, branched and cyclic derivatives. There can also be unsaturated bonds in the molecule. The above compounds typically have 4-24 carbon atoms, preferably 5-12 carbon atoms, most preferably 6-10 carbon atoms.

The term "suspension" is known and relates to a heterogeneous fluid of an internal phase (i.p.) that is a solid and an external phase (e.p.) that is a liquid. The external phase comprises one or more dispersants/surfactants, optionally one or more solvents and optionally one or more pre-polymers and optionally one or more dissolved polymers. Accordingly, each type of luminescent crystal is added to the dedicated portion of suspension. Further processing includes the application of one or each portion of suspension to the desired area onto a preferred substrate. This step is also referred to as solution processing which denotes the application of a coating film or thin element to a preferred substrate by the use of a solution-based (=liquid) starting material.

The term "luminescent crystals" (LC) is known in the field and relates to crystals of 3-500 nm, made of semiconductor materials. The term comprises quantum dots, typically in the range of 3-15 nm and nanocrystals, typically in the range of more than 15 nm and up to 100 nm (preferably up to 50 nm) and crystals, typically in the range more than 100 nm and up to 500 nm. Preferably, luminescent crystals are approximately isometric (such as spherical or cubic). Particles are considered approximately isometric, in case the aspect ratio (longest:shortest direction) of all 3 orthogonal dimensions is 1-2. Accordingly, an assembly of LCs preferably contains 50-100% (n/n), preferably 66-100% (n/n) much preferably 75-100% (n/n) isometric nanocrystals.

LCs show, as the term indicates, luminescence or more specifically defined photoluminescence. In the context of the present invention the term luminescent crystal includes single crystals or can be polycrystalline particles. In the latter case, one particle may be composed of several crystal domains (grains), connected by crystalline or amorphous phase boundaries. A luminescent crystal is spatially separated from other particles due to the presence of a surfactant. It is a semiconducting material which exhibits a direct bandgap (typically in the range 1.1-3.8 eV, more typically 1.4-3.5 eV, even more typically 1.7-3.2 eV). Upon excitation/illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence. In the context of the present invention LCs do not exhibit mechano-luminescence (e.g. piezoluminescence), chemi-luminescence, electrochemi-luminescence nor thereto-luminescence.

The term "quantum dot" (QD) is known and particularly relates to semiconductor nanocrystals, which have a diameter typically between 3-15 nm. In this range, the physical diameter of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent anymore as nonradiative pathways for exciton recombination may become dominant. Thus, QDs are a specific subgroup of nanocrystals, defined in particular by its size and size distribution. Properties of the QDs are directly linked with these parameters, distinguishing them from nanocrystals.

The term "matrix" is known in the field and in the context of this invention denotes continuous material encompassing a discontinuous or particulate phase.

The term "QD composite" denotes a solid inorganic/organic composite material comprising LCs/QD, surfactant and a matrix. The form of a QD composite includes films, fibers and bulk material. QD composites are used for applications where the LCs/QD's only have an optical function, as the LCs/QD's are not electronically addressed.

In QD composites, the LCs/QD's are embedded in a matrix, such as a polymer matrix or an inorganic matrix, in order to spatially separate the LCs/QD's from each other. Depending on the use, the thickness of a QD composite film may vary over a broad range, but typically is 1-1000 microns.

The term "QD layer" denotes a thin layer comprising luminescent crystals (specifically QDs) and surfactant and are free of, or essentially free of additional components, such as matrix/binder. QD layers may find various applications, including quantum dot light emitting diodes (QLED) or quantum dot solar cells. In these applications, the LCs/QDs are electronically addressed; a current flows through the QD-layer by applying a voltage. Depending on the use, the thickness of a QD layer may vary over a broad range, but typically is 3-200 nm, preferably 5-100 nm, most preferably 6-30 nm. A QD layer can be composed of a monolayer of LCs/QDs, thus having a thickness equal to the size of the LCs/QDs used and thus defining a lower limit of the thickness.

The term "RoHS compliance" refers to embodiments of the present invention that comply with RoHS ("Restriction of Hazardous Substances") Directive by the European Union. At the time of filing the present patent application the applicable directive 2011/65/EU generally restricted the use of the following elements: Lead (Pb)<1000 ppm by weight, Mercury (Hg)<1000 ppm, Cadmium (Cd)<100 ppm, Hexavalent chromium (Cr6+)<1000 ppm, Polybrominated biphenyls (PBB)<1000 ppm, Polybrominated diphenyl ether (PBDE)<1000 ppm.

The term "quantum yield (QY)" is known in the field and relates to the amount of times a specific event occurs per photon that is absorbed in the system. In the context of the present invention the term "quantum yield" refers to the "photoluminescence quantum yield" of the described substance and both terms are used with identical meaning. The "photoluminescence quantum yield" defines how many photons of a longer wavelength (lower energy) are emitted by the described system per photon that is absorbed by the system.

The term "polymer" is known and includes organic synthetic materials characterized by its repeating units, molecular weight and further parameters. The term "pre-polymer" shall include both, monomers and oligomers. The term polymer thus includes as exemplary embodiments acrylate polymers, carbonate polymers, sulfone polymers, epoxy polymers, vinyl polymers, urethane polymers, imide polymers, ester polymers, furane polymers, melamine polymers, styrene polymers and silicone polymers and cyclic olefin copolymers.

A first aspect of the invention concerns a solid polymer composition comprising luminescent crystals, surfactants and hardened/cured polymer.

The solid polymer composition comprises Luminescent Crystals/Quantum Dots (LCs/QDs) of formula (I): The luminescent crystals are of 3-500 nm size. Preferably, the LCs/QDs have a narrow size distribution, as indicated by the low FWHM values of the emission peaks. The luminescent crystals are selected from compounds of formula (I), $$[M^1A^1]_aM^2{}_bX_c \qquad (I),$$

wherein:

$A_1$ represents one or more organic cations selected from the group consisting of ammonium, formamidinium, guanidinium, imidazolium, pyridinium, pyrrolidinium, protonated thiourea, $M^1$ represents one or more alkaline metals selected from Cs, Rb, K, Na, Li, $M^2$ represents one or more metals selected from the group consisting of Ge, Sn, Pb, Sb, and Bi, X represents one or more anions selected from the group consisting of chloride, bromide, iodide, cyanide, thiocyanate, isothiocyanate and sulfide, a represents 1-4,
b represents 1-2, and
c represents 3-9.

The solid polymer composition comprises one or more surfactants selected from the group of non-ionic, anionic, cationic, zwitter-ionic surfactants and mixtures thereof.

One or more surfactants encompass surfactants of the same or of different type.

The solid polymer composition comprises a hardened/cured polymer. Preferably, the hardened/cured polymer is light transmissive, i.e. non-opaque for allowing light emitted by the luminescent crystals, and possible light of a light source used for exciting the luminescent crystals to pass. Said polymer preferably is selected from the group consisting of acrylate polymers, epoxy polymers, urethane polymers, styrene polymers, silicone polymers, carbonate polymers, and cyclic olefin copolymers.

This aspect of the invention shall be explained in further detail below, with emphasis given to the compounds of formula (I); surfactants; hardened/cured polymer; LC/QDs and preferred embodiments.

The compounds of formula (I) include stoichiometric and non-stoichiometric compounds. Compounds of formula (I) are stoichiometric, in case a, b and c represent a natural number (i.e. positive integers); they are non-stoichiometric, in case a, b and c represent a rational number, excluding natural numbers. In one embodiment, the invention relates to LCs/QDs of formula (I), where a=1, b=1, c=3.

As can be seen from the above formula (I), the compounds subject to this invention are hybrid materials in that they contain two types of cations. While cation $A^1$ is an organic cation, cation $M^2$ (and $M^1$, if present) is a metal cation. Such hybrid materials, particularly in the form of Perovskite Nanoparticles, have beneficial properties. A broad range of hybrid materials (I) comprising organic cations $A^1$ are available following the inventive manufacturing method. It is understood that according to the invention the presence of $A^1$ is mandatory. However, the amount of $M^1$ may vary over a broad range. Accordingly, the invention provides for the following:

Compounds of formula (I) where cations $M^1$ and $A^1$ are statistically distributed over the same position in the crystal lattice. This is indicated by square brackets $[M^1A^1]$; herein, they are termed hybrid perovskites.

Compounds of formula (I-3) define a specific sub-group of such hybrid perovskites; herein termed organic-inorganic perovskites.

Compounds of formula (I-2) define a further specific sub-group of such perovskites. According to this sub-group, no $M^1$ is present, herein termed organic perovskites.

Compounds of formula (I-1) define a further specific sub-group of such perovskites. According to this sub-group, more than one anion X is present.

In its idealized form of compounds of formula (I), the anions X define a cubic structure (either undistorted or distorted to orthorhombic, tetragonal or trigonal); the smaller cation $M^2$ has a coordination number of 6 and the larger cation $[M^1A^1]$ has a coordination number of 12. Accordingly $A^1$ and $M^1$ (if present) are randomly located at the same position within the crystal structure; and are therefore indicated by square brackets [ . . . ].

Suitable organic cations $A^1$ may be selected from the group consisting of formamidinium cations (IV-1), ammonium cations (IV-2), guanidinium cations (IV-3), protonated thiourea cations (IV-4), imidazolium cations (IV-5), pyridinium cations (IV-6), pyrrolidinium cations (IV-7),

(IV-1)

(IV-2)

(IV-3)

(IV-4)

(IV-5)

(IV-6)

(IV-7)

wherein the substituents R represents, independent from each other, hydrogen, or $C_{1-4}$ alkyl, or phenyl, or benzyl and in case R is connected to carbon it additionally represents independent from each other halide or pseudohalide.

For (IV-1), $R^2$ preferably represents hydrogen; and $R^1$ preferably represents methyl or hydrogen or halide or pseudohalide. Preferred cations are selected from the group consisting of the acetamidinium, formamidinium (FA). FA is the preferred cation.

For (IV-2), R preferably represents hydrogen and methyl, ethyl, n-propyl, iso-propyl, n-butyl, iso-butyl, tert-butyl, phenyl, benzyl. Preferred cations are selected from the group consisting of benzylammonium, iso-butylammonium, n-butylammonium, t-butylammonium, diethylammonium, dimethylammonium, ethylammonium, methylammonium (MA), phenethylammonium, iso-propylammonium, n-propylammonium. MA is the preferred cation.

For (IV-3), $R^2$ preferably represents hydrogen, resulting in the parent compound, the guanidinium cation.

For (IV-4), $R^2$ preferably represents hydrogen, resulting in the parent compound, the protonated thiourea cation.

For (IV-5), $R^2$ preferably represents methyl or hydrogen. Imidazolium is the preferred cation.

For (IV-6), $R^2$ preferably represents methyl or hydrogen. Pyridinium is the preferred cation.

For (IV-7), $R^2$ preferably represents methyl or hydrogen. Pyrrolidinium is the preferred cation.

In one embodiment, the invention relates to LCs/QDs of formula (I), where no $M^1$ is present. In this embodiment, the invention relates to compounds of formula (I-2)

$$A^1_a M^2_b X_c \tag{I-2}$$

where
the substituents are as defined herein.

In this specification, such compounds of formula (I-2) are termed organic perovskites, due to the absence of $M^1$.

In one further embodiment, the invention relates to LCs/QDs of formula (I), where $M^1$ is present up to 90 mol % when calculated on the basis of $M^1+A^1$. In this embodiment, $M^1$ and $A^1$ are statistically distributed and relate to compounds of formula (I-3)

$$[M^1_{a'}A^1_{a''}]_a M^2_b X_c \qquad (I\text{-}3),$$

wherein:
$a'+a''=1$ and $a'/(a'+a'')<0.9$ and $a'>0$, and
the remaining substituents are as defined herein.

In this specification, such compounds of formula (I-3) are termed inorganic-organic perovskites, due to the presence of $M^1$.

In one embodiment, the invention relates to LCs/QDs of formula (I), where $M^1$=Cs. In one embodiment, the invention relates to LCs/QDs of formula (I), where $A^1$=FA. In one embodiment, the invention relates to LCs/QDs of formula (I), where $M^2$=Pb. In one embodiment; the invention relates to LCs/QDs of formula (I), where X is a combination of at least two elements selected from the list of Cl, Br, and I.

In one embodiment, the invention relates to LCs/QDs of formula (I), selected from $FA_1Pb_1X_3$, particularly $FAPbBr_3$, $FAPbBr_2I$. This embodiment also includes corresponding molar mixtures of FABr and PbBr2 or mixtures of FAI and PbBr2.

In one further embodiment, the invention relates to LCs/QDs of formula (I) further including doped materials, i.e. wherein part of $M^1$ is replaced by other alkaline metals, or wherein part of $M^2$ is replaced by other transition metals or rare earth elements, or wherein part of X is replaced by other halogenides, or wherein part of $A^1$ is replaced by other cations as defined herein. Dopants (i.e. replacing ions) are generally present in an amount of less than 1% in respect to the ion they are replacing.

In one further embodiment the invention relates to LCs/QDs of formula (I-2), selected from $A^1SnX_3$, $A^1_3Bi_2X_9$, $A^1GeX_3$.

In one further embodiment the invention relates to LCs/QDs of formula (I) wherein part of X is replaced by one or more anions selected from the group consisting of cyanide, thiocyanate, isothiocyanate and sulfide. As exemplary embodiments are identified $$A^1_a M^2_b [X^1_{c'} X^2_{c''}] \qquad (I\text{-}1),$$

wherein:
$A^1$, $M^2$, a, b are as identified above;
$X^1$ represents one or more anions selected from the group of halides as identified above;
$X^2$ represents an anion different from $X^1$, selected from the group of pseudohalides or sulfide, as identified above;
$c'+c''$ represents a natural number from 3 to 9 and $c'/c''>0.9$. As sulfide is 2-, it counts twice when calculating $c'$, $c''$.

Exemplary embodiments of formula (I-1) include $FAPbCl_{2.9}CN_{0.1}$, $FASnBr_2(SCN)_1$, $FA_3Bi_2Br_{8.8}(NCS)_{0.2}$, and $FAPbBr_{0.43}I_{2.43}S0.07$.

The materials of formula (I) are available in analogy to known methods, e.g. from application PCT/CH2016/000081 or Aygüler et al. as cited above.

The materials of formula (I) have multiple uses and are specifically applicable for a luminescent component according to a second and third aspect of the invention.

The emission of light with a specific wavelength of the luminescent crystals depends on a selection of the material of the luminescent crystals within the constraints of this first aspect of the invention, in particular within the constraints of formula (I), and depends on a size of the luminescent crystals.

Suitable amounts of LCs/QDs in the inventive polymer composition may vary over a broad range and determined by routine experiments. In a preferred embodiment, the solid polymer composition has the weight ratio LCs/QDs:matrix (polymer+surfactant) in the range of 0.00001-0.2 or 0.0001-0.1, and/or has the weight ratio surfactant:LCs/QDs in the range of 100-0.01.

In a preferred embodiment, the luminescent crystals of formula (I) are selected from the group of $FA_1Pb_1X_3$. In this embodiment, the surfactant preferably comprises a zwitterionic surfactant, and/or the polymer preferably is selected from the group of acrylates.

Surfactant: A broad variety of surfactants may be used in the context of the present invention. Suitable surfactants may be determined in routine experiments; its choice depends mainly on the polymer used in the next step and the nature of solid material. Surfactants may be selected from the class of non-ionic surfactants, cationic surfactants, zwitterionic surfactants and anionic surfactants.

It is known in the art to combine two or more surfactants to improve positive properties; such combination of surfactants being also subject to the present invention. In a further embodiment, the surfactants comprise a mixture of a zwitterionic surfactant and a non-ionic surfactant, preferably a saturated or unsaturated fatty amine.

In a further embodiment, the surfactants are selected from the group of anionic, cationic, non-ionic and zwitter-ionic surfactants comprising apolar end-groups selected from the group of alkyl- or alkyl-ether-chains with 4-30, preferably 6-24, most preferably 8-20 carbon atoms.

In a further embodiment, the surfactants are selected from the group of anionic, cationic, non-ionic and zwitter-ionic surfactants, having one or more chemical moieties selected from the group of alkyl ethers with the formula (II)

$$RO-(C_2H_4O)_m(C_3H_6O)_n- \qquad (II),$$

whereby
m and n independently are 0-10, but $m+n>2$ and
R represents $C_{1-5}$-alkyl.

In a preferred embodiment the surfactant comprises one or more compounds selected from the following list: SP 13300, SP 20000, SP 24000SC, SP 41000, SP540, BYK9077, Hypermer KD1-SO-(AP), Span65, Span80, Span85, methoxy-ethoxy-ethoxy-acetic acid, oleylamine, oleic acid, stearic acid, Poly(maleic anhydride-alt-1-octadecene), oleylammonium bromide, 3-(N,N-dimethyl-octadecyl-ammonio)propane sulfonate, miltefosine and TOPO.

Non-ionic surfactants include: maleic polymers such as Poly(maleic anhydride-alt-1-octadecene), polyamines, alkylamines, (e.g. N-alkyl-1,3-propylene-diamines, N-alkyl-dipropylene-triamines, N-alkyltripropylene-tetraamines, N-alkylpolypropylene-polyamines,) poly-(ethyleneimine), polyesters, alkyl esters (e.g. cetyl palmitate), alkyl polyglycol ethers (such as fatty alcohol polyglycol ether with 3-25 ethoxy units (EO), e.g. Dehypon E124) and oxoalcohol polyglycolether), mixed alkyl/aryl polyglycolethers, alkyl polyglucosides (APGs), fatty alcohols, such as stearyl alcohols (e.g. Lorol C18™), N-acylamides (e.g. N-oleoyl-gamma-aminobutyric acid).

Non-ionic surfactants further include polymeric ethoxylate and/or propoxylate (EO/PO) adduct surfactants, such as fatty alcohol alkoxylates, alcohol EO/PO adducts (including fatty alcohol EO/PO adducts, oxo alcohol EO/PO adducts), EO/PO block-copolymers, ethylene diamine ethylene oxide-propylene oxide (EO/PO) block-copolymers, endcapped (fatty) alcohol EO adducts and EO/PO adducts (e.g. butyl endcapped), esters of carboxylic acids, in particular EO/PO adducts and sorbitan esters (e.g. from the group of SPAN). Non-ionic surfactants further include alkoxy-silanes and hydrolyzed products thereof.

Non-ionic surfactants further include alkylphosphines, alkylphosphine oxides (e.g. trioctylphosphine oxide—TOPO) and alkylthiols.

Non-ionic surfactants further include alkyl esters of fatty acids (e.g. cetyl palmitate, lauric acid, capric acid). A preferred class of non-ionic surfactants are alkylimines alkylamines, e.g. dioctylamine, oleylamine, octadecylamine, hexadecylamine.

Cationic surfactants include: alkylammonium halides, e.g. oleylammonium bromide, alkyltrimethylammonium halides e.g. cetyltrimethylammonium bromide, dialkyldimethylammonium halides such as e.g. distearyldimethylammonium chloride, trialkylmethylammonium halides e.g. trioctylmethylammonium chloride, diquarternary polydimethylsiloxanes.

Zwitterionic surfactants, also called amphoteric surfactants, are a known class of compounds. They consist of a cationic part, preferably an amine salt, a quaternary ammonium group, sulfonium or phosphonium and an anionic part preferably a carboxylate, sulfonate, sulfite, sulfate, phosphinate, phosphonate, phosphite or phosphate group. Zwitterionic surfactants most preferably comprise quaternary ammonium as the cationic part and carboxylate, sulfonate or phosphonate as the anionic part. Examples of zwitterionic surfactants include: betaines, such as caprylic glycinate, cocamidopropylbetain, and disodium cocoampho diacetate; 3-(N,N-dimethylalkylammonio)propane sulfonate, alkylphospoazanium zwitterion.

Specific groups of zwitterionic surfactants include:
Ammonium carboxylates according to formula (V-1),
Ammonium derivatives according to formulae (V-2),
Phosphocholines according to formula (V-3),
1-Ammonium-2-propanol derivatives of formula (V-4),
Amidoalkyl ammonium carboxylates of formula (V-5),
Amidoalkyl ammonium derivatives of formula (V-6), and
1-(Amidoalkyl-ammonium)-2-hydroxy-propyl derivatives of formula (V-7).

Ammonium carboxylates according to formula (V-1),

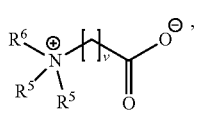
(V-1)

wherein:
$R^5$ is H or methyl,
v is 1-8, and
$R^6$ is an apolar tail, selected from substituted or unsubstituted hydrocarbons.

$R^6$ is preferably selected from the group of alkyl, alkoxy-alkyl, aryl-alkyl, aryloxy-alkyl, and alkenyl.

$R^6$ is particularly preferably selected from linear or branched alkyl, more preferably a linear or branched $C_{8-30}$ alkyl, most preferably $C_{10-20}$alkyl.

v preferably represent an integer from 1-4.

Specific subgroups of ammonium carboxylates according to (V-1) include glycinates where $R^5$ is H and v is 1, dimethyl ammonium betaines where $R^5$ is $CH_3$ and v is 1, and ammonium propionates where $R^5$ is H and v is 2).

Ammonium derivatives according to formula (V-2),

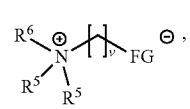
(V-2)

wherein:
$R^5$, $R^6$ and v are as defined in formula (V-1), and
FG represents a negatively charged functional group.

FG preferably is selected from the group consisting of sulfonate (end group —$SO_3^-$), sulfite (end group O—$SO_2^-$), sulfate (end group —O—$SO_3^-$), phosphonate (end group —P(OR$^7$)$O_2^-$), phosphinate (end group —PR$^7O_2^-$), phosphate (end group —O—P(OH)$O_2^-$) and phosphite (end group —O—P(H)$O_2^-$).

$R^7$ is preferably selected from the group of alkyl, alkoxy-alkyl, aryl-alkyl-, aryloxy-alkyl-, and alkenyl.

$R^7$ is particularly preferably selected from linear or branched alkyl, more preferably a linear or branched $C_{8-30}$ alkyl, most preferably $C_{10-20}$alkyl.

A preferred subgroup are ammonium sulfonates according to formula (V-2.1),

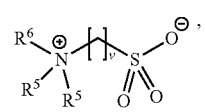
(V-2.1)

wherein:
$R^5$, $R^6$ and v are as defined in formula (V-2).

Specific subgroups of ammonium sulfonates according to formula (V-2.1) include sulfobetaines wherein $R^5$ is $CH_3$).

A further preferred subgroup are Ammonium sulfites according to formula (V-2.2),

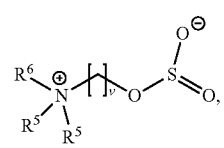
(V-2.2)

wherein:
$R^5$, $R^6$ and v are as defined in formula (V-2).

Specific subgroups of ammonium sulfites according to formula (V-2.2) include sulfitobetaines wherein $R^5$ is $CH_3$.

A further preferred subgroup are ammonium sulfates according to formula (V-2.3),

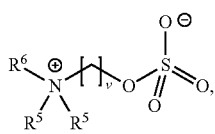
(V-2.3)

wherein:
$R^5$, $R^6$ and v are as defined in formula (V-2).

Specific subgroups of ammonium sulfates of formula (V-2.3) include sulfatobetaines wherein $R^5$=$CH_3$.

A further preferred subgroup are ammonium phosphonates according to formula (V-2.4),

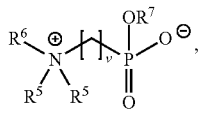
(V-2.4)

wherein:
$R^5$, $R^6$, $R^7$ and v are as defined in formula (V-2), and

Specific subgroups of ammonium phosphonates according to formula (V-2.4) include phosphonatebetaines where $R^5$ is $CH_3$.

A further preferred subgroup are ammonium phosphinates according to formula (V-2.5),

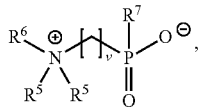
(V-2.5)

wherein:
$R^5$, $R^6$, $R^7$ and v are as defined in formula (V-2). Specific subgroups of ammonium phosphinates according to formula (V-2.5) include phosphinatebetaines where $R^5$=$CH_3$.

A further preferred subgroup are ammonium phosphates according to formula (V-2.6),

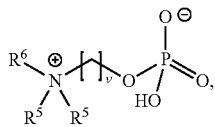
(V-2.6)

wherein:
$R^5$, $R^6$ and v are as defined in formula (V-2).

Specific subgroups of ammonium phosphates according to formula (V-2.6) include phosphatobetaines where $R^5$=$CH_3$.

A further preferred subgroup are ammonium phosphites according to formula (V-2.7),

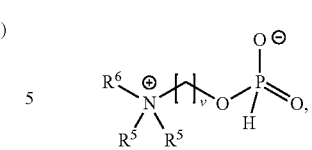
(V-2.7)

wherein:
$R^5$, $R^6$ and v are as defined in formula (V-2).

Specific subgroups of ammonium phosphites according to formula (V-2.7) include phosphitobetaines where $R^5$=$CH_3$.

Phosphocholine derivatives according to formula (V-3),

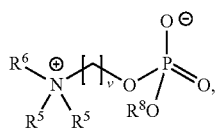
(V-3)

wherein
v is 1-8, preferably 1-4, particular preferably 2,
$R^5$ is as defined in formula (V-1),
$R^6$ is hydrogen or methyl, and
$R^8$ is an apolar tail, selected from substituted or unsubstituted hydrocarbons.
$R^8$ is preferably selected from the group of alkyl, alkoxy-alkyl, aryl-alkyl-, aryloxy-alkyl-, and alkenyl.
$R^8$ is particularly preferably selected from linear or branched alkyl, more preferably a linear or branched $C_{8-30}$ alkyl, most preferably $C_{10-20}$alkyl.

Specific subgroups of phosphocholines according to formula (V-3) include phosphitobetaines where $R^5$ and $R^6$ are $CH_3$. A specific example is miltefosine.

1-Ammonium-2-propanol-derivatives of formula (V-4),

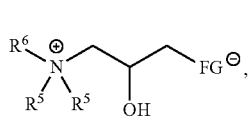
(V-4)

wherein:
$R^5$ and $R^6$ are as defined in formula (V-1), and
FG represents a negatively charged functional group.

FG preferably is selected from the group consisting of sulfonate (end group —$SO_3^-$), sulfite (end group O—$SO_2^-$), sulfate (end group —O—$SO_3^-$), phosphonate (end group —$P(OR^7)O_2^-$), phosphinate (end group —$PR^7O_2^-$), phosphate (end group —O—$P(OH)O_2^-$) and phosphite (end group —O—$P(H)O_2^-$) wherein $R^7$ is defined above.

FG particularly preferably represents sulfonate. Specific subgroups of compounds of formula (V-4) include hydroxyl sulfobetaines where $R^5$ and $R^6$ is $CH_3$ and FG is —$SO_3^-$.

Amidoalkyl ammonium carboxylates of formula (V-5),

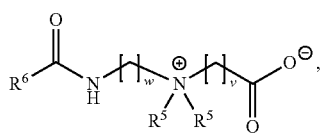
(V-5)

wherein:
R⁵, R⁶, and v are as defined in formula (V-1), and
w is 2-5, preferably 2.

Amidoalkyl ammonium derivatives of formula (V-6),

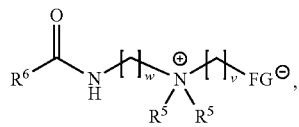
(V-6)

wherein:
R⁵, R⁶, and v are as defined in formula (V-1),
w is 2-5, preferably 2, and
FG represents a negatively charged functional group.

FG preferably represents a sulfonate (end group —SO₃⁻), sulfites (end group O—SO₂⁻) and sulfates (end group —O—SO₃⁻), phosphonates (end group —P(OR⁷)O₂⁻), phosphinates (end group —PR⁻⁷O₂⁻), phosphates (end group —O—P(OH)O₂⁻) and phosphites (end group —O—P(H)O₂⁻) and wherein R⁷ is defined above.

FG particularly preferably represents a sulfonate. Specific subgroups of amidoalkyl ammonium sulfonates include amido alkyl sulfobetaines where R⁵ is CH₃ and FG is —SO₃⁻.

1-(Amidoalkyl-ammonium)-2-hydroxy-propyl derivatives according to formula (V-7)

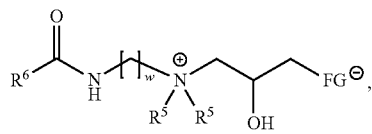
(V-7)

wherein:
R⁵ and R⁶ are as defined in formula (V-1), and
FG represents a negatively charged functional group.

FG particularly preferably represents a sulfonate. Specific subgroups of amidoalkyl hydroxy ammonium sulfonates include amidoalkyl hydroxyl sulfobetaines where R⁵ is CH₃ and PG is —SO₃⁻.

Imidazoline-derived amphoteric surfactants: This group includes amphoacetates (mono or diacatates) and amphopropionates.

Anionic surfactants are a known class of compounds and include sulfates, sulfonates, phosphates, and carboxylates. Specific examples include phosphate esters of alkyl ethers, ammonium lauryl sulfate, alkali lauryl sulfate and the related alkyl-ether sulfates e.g. alkali laureth sulfate.

In a further embodiment, the anionic surfactants are carboxylates from the class of fatty acids, such as oleic acid, stearic acid, palmitic acid.

In a further embodiment, anionic surfactants are selected from monocarboxylic acids comprising a polyether tail according to formula (II-1),

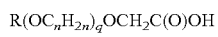
R(OCₙH₂ₙ)qOCH₂C(O)OH  (II-1), wherein:
R is C₁₋₅-alkyl,
q is an integer from 0 to 5 and
n is an integer from 2 to 3.

Five particularly preferred compounds of that class are shown in formula (II-1a):

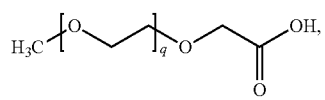
(II-1a)

wherein:
q is from 0-4.

This corresponds to a carboxylic acid of formula (II), wherein R=Methyl, n=2 and q is an integer from 0-4.

A particularly preferred compound of that class is of formula (II-1b):

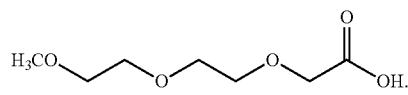
(II-1b)

Polymers: In an advantageous embodiment, the hardened/cured polymer comprises or consists of acrylate polymers.

The term acrylate polymers relates to polymers comprising or consisting of repeating units of formula (III),

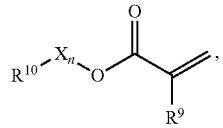
(III)

wherein:
R⁹ represents H or CH₃,
R¹⁰ represents an cyclic, linear or branched C₁₋₂₅ alkyl, or a cyclic, linear or branched C₂₋₂₅ alkenyl group, or a C₆₋₂₆ aryl group, each optionally substituted with one or more cyclic, linear or branched C₁₋₂₀ alkyl, phenyl or phenoxy,
n represents 0 or 1, and
X represents a spacer from the group of alkoxylates comprising 1-40 carbon atoms and 1-10 oxygen atoms.
X preferably represents a spacer of formula (IIIa),

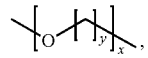
(IIIa)

wherein:
x represents 1-10, preferably 1, 2, 3, or 4.
y represents 0, 1, 2, 3 or 4, preferably 2.

Thus, compounds of formula (III) include acrylates of formulae (III-1) and (III-2) where R9 is H, and Methacrylates of formula (III-3) and (III-4) where R9 is Methyl, collectively also termed (Meth)acrylates.

Further, compounds of formula (III) also include simple (meth)acrylates where n is 0 and X is not present (formulae (III-1) and (III-3) and alkoxylated (meth)acrylates (formulae (III-2) and (III-4)).

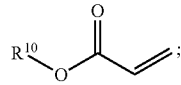
(III-1)

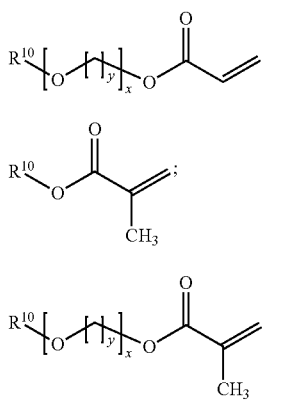

R represents an aliphatic group either saturated or unsaturated group selected from the group of cyclic, linear or linear branched molecules, or an aromatic group.

Acrylate polymers include homo- and co-polymers. Acrylate co-polymers preferably comprise 50-100 wt. % of repeating units according to formula (III), particularly preferably 90-100 wt %. Acrylate homo-polymers comprise one or more, preferably one repeating unit of formula (III). Acrylate pre-polymers include monomers and partially reacted oligomers of formula (III).

$R^{10}$ preferably represents a cyclic, linear or branched $C_{1-25}$ alkyl. Cyclic alkyl includes mono-cyclic and poly-cyclic groups and also includes optionally substituted groups, comprising 1-6 substituents from the group of $C_{1-4}$ alkyl. $R^{10}$ particularly preferably represents methyl, ethyl, propyl, butyl, octyl, lauryl, cetyl, stearyl, 2-ethylhexyl, isooctyl, isodecyl, cyclohexyl, trimethyl-cyclohexyl, isobornyl, dicyclopentenyl.

$R^{10}$ further preferably represents a cyclic, linear or branched $C_{2-25}$ alkenyl group. $R^{10}$ particularly preferably represents allyl, oleyl, $R^{10}$ further preferably represents a $C_{6-26}$ aryl group, optionally substituted with one or more cyclic, linear or branched $C_{1-20}$ alkyl. Aryl includes mono-cyclic and poly-cyclic aryls which may optionally be substituted by 1-4 substituents, said substituents being selected from the group of $C_{1-4}$ alkyl, phenyl and phenoxy. $R^{10}$ particularly preferably represents phenyl, benzyl, 2-naphtyl, 1-naphtyl, 9-fluorenyl.

Specific examples of acrylates of formula (III-1) include: isobornylacrylate and dicyclopentadienylacrylate (CAS 33791-58-1).

Specific examples of acrylates of formula (III-2) and (III-4) include: poly(ethylene glycol) phenyl ether acrylates (specifically 2-phenoxyethyl acrylate), O-phenyl phenoxyethyl acrylate, Polyethylene glycol o-phenylphenyl ether acrylate (CAS 72009-86-0), poly(ethylene glycol) ethyl ether methacrylate, Di(ethylene glycol) ethyl ether acrylate, Poly(ethylene oxide) nonylphenyl etheracrylate, Poly(propylene glycol) 4-nonylphenyl ether acrylate, Ethylene glycol dicyclopentenyl ether acrylate, Ethylene glycol dicyclopentenyl ether methacrylate.

Due to the definition of $R^{10}$, (meth)acrylates of formula (III) are mono-functional.

In a further embodiment, the (meth)acrylates are multi-functional (meth)acrylates. Such multifunctional (meth)acrylates are obtainable in case (meth)acrylic acid is reacted with a polyol to thereby obtain di-, tri-, tetra-, penta- and hexafunctional (meth)acrylates. Suitable polyols for forming multifunctional (meth)acrylate include aliphatic or aromatic $C_{1-30}$ polyols, optionally substituted with one or more $C_{1-4}$alkoxy groups, wherein the number of alkoxy groups is preferably ≤10, more preferably ≤5. Examples of polyols include, glycole, hexanediol, decandiol, bisphenol, fluorene-9-bisphenol, ethoxylated bisphenol comprising 2-6, e.g. 4 ethoxy-groups and ethoxylated fluorene-9-bisphenol comprising 2-6, e.g. 4, ethoxy-groups.

Specific examples of difunctional (meth)acrylates include 1,10-decanediol diacrylate, 1,6-hexanediol diacrylate, 1,6-hexanediol dimethacrylate, Neopentyl glycol dimethacrylate, tricyclodecane dimethanol diacrylate, Bisphenol A ethoxylate diacrylate (including CAS 64401-02-1), Bisphenol A ethoxylate dimethacrylate, modified fluorene-9-bisphenol diacrylate, modified fluorine-9-bisphenol dimethacrylate, 1,3-buthylene glycol dimethacrylate.

Specific examples of trifunctional (meth)acrylates include Ethoxylated trimethylolpropane triacrylate (CAS 28961-43-5), trimetylolpropane triacrylate (CAS 15625-89-5), trimetylolpropane trimethacrylate (CAS 3290-92-4).

Specific examples of tetrafunctional (meth)acrylates include Di(trimethylolpropane) tetraacrylate (CAS 94108-97-1), Pentaerythritol tetraacrylate (CAS 4986-89-4).

Specific examples of hexafunctional (meth)acrylates include Dipentaerythritol hexaacrylate (CAS 29570-58-9).

Among the above discussed (methacrylates), mono- or multifunctional (meth)acrylates are particularly preferred, provided:
$R^{10}$ represents a cyclic C5-25 alkyl group, or
$R^{10}$ represents a cyclic C5-25 alkenyl group, or
$R^{10}$ represents a substituted aryl group.

Among the above discussed mono- or multifunctional (meth)acrylates, very particularly preferred are compounds where $R^{10}$ represents isobornyl; dicyclopentenyl; bisphenol or fluoren-9-bisphenol.

A second aspect of the invention concerns a luminescent component comprising a first element comprising a first solid polymer composition according to the first aspect of the invention, wherein luminescent crystals of the first solid polymer composition emit light of a first wavelength in response to excitation by light with a wavelength shorter than the first wavelength. The luminescent component comprises an encapsulation enclosing the first element, wherein the encapsulation comprises an encapsulation polymer or inorganic matrix.

The inventive luminescent component according to an embodiment provides for LCs/QDs having an average size of 3-500 nm, in particular of 3-100 nm.

Preferably, the luminescent crystals of the first solid polymer composition are of size between 3 nm and 100 nm.

It is preferred that the first element does not spontaneously emit light of a wavelength but does so in response to an excitation, and in particular in response to an excitation with light of a wavelength shorter than the wavelength of the light to be emitted in response to the excitation. Hence, in a preferred embodiment, the first element emits light of a first wavelength, e.g. light in the red spectrum in response to an excitation with e.g. light in the blue spectrum.

In a preferred embodiment, the first wavelength of the light emitted has its peak in the red spectrum which is considered as light with a peak wavelength in the range between 590 nm and 700 nm, preferably with an FWHM (Full Width at Half Maximum) between 15 and 50 nm.

In a different embodiment, the first wavelength of the light emitted has its peak in the green spectrum which is considered as light with a peak wavelength in the range between 490 nm and 570 nm, preferably with an FWHM between 15 and 50 nm.

Preferably the polymer of the first solid polymer composition is not dissolvable in the encapsulation polymer or inorganic matrix, and vice versa, in particular when in contact with each other at least in the solid phase.

In a preferred embodiment of the second aspect, the luminescent component comprises a second element comprising a second solid polymer composition according to the first aspect of the invention. Luminescent crystals of the second solid polymer composition are of a different chemical composition and/or a different size than the luminescent crystals of the first solid polymer composition. The luminescent crystals of the second solid polymer composition emit light of a second wavelength different to the first wavelength in response to excitation by light with a wavelength shorter than each of the first and second wavelength. The encapsulation encloses the second element.

Preferably, the luminescent crystals of the second solid polymer composition are of size between 3 nm and 100 nm.

For example, if the luminescent crystals of the first solid polymer composition emit light in the red spectrum, the luminescent crystals of the second solid polymer composition may be selected to emit light in the green spectrum. Again, it is preferred that the second element does not spontaneously emit light of the second wavelength but does so in response to an excitation, and in particular in response to an excitation with light of a wavelength shorter than the second wavelength and shorter than the first wavelength. The luminescent crystals of the second solid polymer composition may be excited by light in the blue spectrum, for example.

Preferably, the luminescent crystals emitting light in the green spectrum are selected from the group comprising of $FAPbBr_3$, $FAPbBr_xI_{3-x}$ where $2 \leq x < 3$, $FAPbBrxCl_{3-x}$ where $2 \leq x < 3$.

Preferably, the luminescent crystals emitting light in the red spectrum are selected from the group comprising of $FAPbI_3$, $FAPbBr_xI_{3-x}$ where $0 \leq x < 2$.

Preferably, the polymer of the second solid polymer composition is not dissolvable in the encapsulation polymer or inorganic matrix and vice versa, in particular when in contact with each other at least in the solid phase.

In a further preferred embodiment of the second aspect, the luminescent component comprises N further elements with $N \geq 1$, each further element comprising a further solid polymer composition according to the first aspect of the invention. The luminescent crystals of the further solid polymer composition are of a different chemical composition and/or a different size than the luminescent crystals of the first solid polymer composition, the luminescent crystals of the second solid polymer composition, and any luminescent crystals of the N−1 other solid polymer compositions. The luminescent crystals of the further solid polymer composition emit light of a further wavelength in response to excitation by light with a wavelength shorter than the further wavelength, wherein the further wavelength is different from the first wavelength, is different from the second wavelength, and is different from any of the N−1 other further wavelengths, with N being a natural number, wherein $N \geq 1$. Preferably, N is between 3 and 28 ($3 \leq N \leq 28$).

Preferably, the luminescent crystals of the first solid polymer composition are of size between 3 nm and 100 nm.

Preferably the polymer of the further solid polymer composition is not dissolvable in the encapsulation polymer or inorganic matrix, and vice versa, in particular when in contact with each other at least in the solid phase.

In a preferred embodiment, the luminescent component comprises overall between 5 to 30 different elements comprising different luminescent crystals thus leading to a tunable emission spectrum of the luminescent component.

Preferably, the polymer of the first solid polymer composition and the polymer of the second solid polymer composition and the polymer of any further solid polymer composition, if present, are identical.

Preferably, the surfactant of the first solid polymer composition and the surfactant of the second solid polymer composition and the surfactant of any further solid polymer composition, if present, are identical.

By selecting the respective polymer materials appropriately, the luminescent crystals of the first solid polymer composition are confined in the first element and cannot interact with luminescent crystals outside the first element, e.g. in a second or further element. If the polymers are properly selected, preferably also the luminescent crystals of the second solid polymer composition are confined in the second element and cannot interact with the luminescent crystals outside the second element and the luminescent crystals of the further solid polymer composition are confined in the further element and cannot interact with the luminescent crystals outside the further element.

In a further preferred embodiment of the luminescent component of the second aspect, the first element and the second element and any further element, if present, are arranged spaced within the encapsulation.

In the case of the luminescent component comprising a first element only but no second or further elements, not only a single first element may be provided in the luminescent component, but multiple first elements in order to enhance its luminosity. In the case of the luminescent component comprising first and second elements only but no further elements, multiple first elements and multiple second elements may be provided in the luminescent component in order to enhance its luminosity. In the case of the luminescent component comprising first, second and further elements, multiple first elements, multiple second elements and multiple further elements of each kind may be provided in the luminescent component in order to enhance its luminosity. It may be preferred that the multiple first elements and the multiple second elements and possible multiple further elements are arranged alternating or are arranged random in the encapsulation.

In a further preferred embodiment of the second aspect of the invention, the encapsulation fully encloses the first element, and in case of multiple first elements, encapsulates all first elements. However, in a different scenario in case of multiple first elements, one or more of these first elements may reside at an outer surface of the encapsulation such that for those first elements the encapsulation is a partial encapsulation instead of a full encapsulation. However, even in these instances, there is at least one other first element fully enclosed by the encapsulation. This concept is also applicable to second or further elements, if any.

In a preferred embodiment of the second aspect of the present invention, if a second or further element is present, this second or further element preferably is separated from the first element by the encapsulation. The first and the second and the further element if present are arranged spaced in the encapsulation. Hence, any gap between elements is filled by the material of the encapsulation, such as the solid encapsulation polymer or the inorganic matrix.

It is preferred that the polymer of the encapsulation, the polymer of the first element, the polymer of the second element, and any further polymer of any further element do not dissolve with each other when in contact, at least when in contact in the solid phase.

Preferably, the encapsulation polymer is a polymer selected from the list of acrylate polymers, carbonate polymers, sulfone polymers, epoxy polymers, vinyl polymers, urethane polymers, ester polymers, styrene polymers, silicone polymers, olefin polymers and cyclic olefin copolymers, preferably silicones, cyclic olefin copolymers acrylates, epoxies, and halogenated vinyl polymers, most preferably epoxy polymers and acrylate polymers or co-polymers or mixtures thereof.

Preferably, the encapsulation polymer has a water vapor permeability of less than 5 g mm m$^{-2}$ day$^{-1}$ (determined at a temperature of 38° C. and 90% relative humidity and atmospheric pressure). The water vapor permeability of the polymer is characteristic to the specific polymer and is i.a. dependent on the thickness of an applied polymer layer.

In another embodiment, the encapsulation is preferably an inorganic matrix. The inorganic matrix preferably is obtained from a liquid precursor which forms an inorganic matrix upon thermal decomposition or reaction with humidity/water. Such precursors include one or more of metal alkoxides (such as alkoxy-silanes), metal hydroxides (such as hydroxy-silanes), and liquid silicates (such as sodium silicates, potassium silicates and lithium silicates).

Preferably, the encapsulation, and preferably also each polymer of the first element, of the second element and of any further element, if present, is transmissive for light in the visible spectrum, i.e. is non-opaque.

In a preferred embodiment, the encapsulation may take the shape of a film or layer, i.e. with a length and width exceeding a thickness of the encapsulation, and preferably exceeding the thickness at least ten times.

In a further preferred embodiment, the encapsulation, preferably the encapsulation polymer or inorganic matrix thereof, comprises additional luminescent crystals according to formula (I).

The additional luminescent crystals which might be comprised in the encapsulation are preferably of different chemical composition and/or size than the luminescent crystals of the first solid polymer composition. In addition, the additional luminescent crystals emit light of a wavelength different to the first wavelength in response to excitation by light with a wavelength shorter than the first wavelength.

Preferably, the additional luminescent crystals comprised in the encapsulation are of different chemical composition and/or size than the luminescent crystals of the second and/or further solid polymer composition, if present. The additional luminescent crystals emit light of a wavelength different to the second and/or further wavelength in response to excitation by light with a wavelength shorter than each of the first, second, and/or further wavelength.

An embodiment of the invention can comprise an encapsulation comprising an encapsulation polymer or inorganic matrix. The additional luminescent crystals can be embedded directly in such encapsulation polymer or inorganic matrix.

In a further preferred embodiment of the second aspect, the luminescent component comprises one or more barrier films each having a water vapor transmission rate of less than 0.1 g m$^2$ day$^{-1}$ (determined at a temperature of 38° C. and 90% relative humidity and atmospheric pressure).

Such barrier film may in particular have a low water vapour transmission rate in order to avoid a degradation of the luminescent crystals in the component in response to being exposed to water. The barrier film may in one embodiment be permeable for 02, or, in a different embodiment, may also be impermeable for oxygen. Preferably, the barrier film is transmissive for light, and preferably, such barrier film may be present in the form of a single layer or in the form of multilayers.

In any of the above and below embodiments, the component may include a barrier film on top of an otherwise exposed surface of the luminescent component.

In a preferred embodiment, barrier films may be attached to both sides of the encapsulation in case of a rectangular, sheet-like luminescent component.

Preferably, a material of each barrier film is selected from the group consisting of polyvinylidene chlorides, cyclic olefin copolymers, high-density polyethylene, metal oxides, silicon oxide, silicon nitride; optionally in the form of organic/inorganic multilayers.

In a further preferred embodiment of the luminescent component of the second aspect, a mean diameter of the first elements, second elements if present, and any further elements if present independently is between 1 μm and 500 μm, preferably between 5 μm and 100 μm.

In a further preferred embodiment of the luminescent component of the second aspect, the first element comprises luminescent crystals of the first solid polymer composition only and is therefore free from any other luminescent crystals. The second element, if present, comprises luminescent crystals of the second solid polymer composition only and is free from any other luminescent crystals. The further element, if present, comprises luminescent crystals of the further solid polymer composition only and is free from any other luminescent crystals. By these means, each element is dedicated to solely emitting light in the assigned peak wavelength, and no light of a different color.

The concept of this embodiment may hold for any first element in case of multiple first elements, and for any second element in case of multiple second elements, etc.

The preferred embodiment of the present luminescent component of the second aspect provides for a spatial separation of the luminescent crystals of the first solid polymer composition, the second solid polymer composition and any further solid polymer compositions. The separation is achieved by embedding the one or more first elements in the encapsulation. Hence, the luminescent crystals of the first solid polymer composition are arranged in the dedicated one or more first elements only, while any luminescent crystals of the second solid polymer composition or further solid polymer composition are provided in associate elements only. By doing so an exchange of cations and anions between the luminescent crystals of the first solid polymer composition on the one hand and any of the luminescent crystals of the second or further solid polymer composition on the other hand is avoided. Given that the fabrication of the each of the different elements preferably is performed in a suspension, a mixing of luminescent crystals of the first solid polymer composition and luminescent crystals of the second or further solid polymer composition in a common suspension is avoided. Such mixing in a common suspension instead would result in a conversion of the luminescent crystals of the first, second, and further solid polymer composition into different luminescent crystals by way of reaction/recombination based on the above mentioned ion exchange. As a result, such different luminescent crystals would possibly emit light of a different wavelength than supposed for the first, second or further solid polymer composition. Hence, luminescent crystals of different kind are separated at the stage of manufacturing, and hence are added to different portions of the suspension resulting in the above first, second or further elements after hardening/curing/drying.

Each portion of the suspension preferably comprises the assigned luminescent crystals, a solvent, a surfactant and a polymer. Given that the resulting elements are solid elements, an interaction of the luminescent crystals of the first solid polymer composition in the first element with any luminescent crystals of the second solid polymer composition in a second element is avoided.

Preferably, a concentration of the respective luminescent crystals with respect to a polymer and surfactant matrix representing the solid polymer composition of the first element in case of red light emission is between 0.01 wt % and 10.0 wt %, preferably between 0.05 wt % and 6.0 wt %, most preferably between 0.1 wt % and 2.6 wt %; and for a second element if any in case of green light emission preferably between 0.01 wt % and 10.0 wt %, preferably between 0.05 wt % and 6.0 wt %, most preferably between 0.1 wt % and 2.1 wt %.

In a preferred embodiment, if the luminescent crystals emit red light and are of $FAPbI_3$ a concentration of the luminescent crystals is 3.03 wt %; and if the luminescent crystals are of $FAPbBr_2I$, a concentration of the luminescent crystals is 2.63 wt %.

In a preferred embodiment, if the luminescent crystals emit green light and are of $FAPbBr_3$ a concentration of the luminescent crystals is 2.38 wt %; and if the luminescent crystals are of $FAPbBr_2Cl$, a concentration of the luminescent crystals is of 2.17% wt.

The upper limit of this concentration range supports RoHS compliance under the condition that the luminescent component comprises 99 wt % encapsulant, while the lower limit of this concentration range provides for a sufficient emission at reasonable component thickness under the condition that the luminescent component comprises 50 wt % encapsulant.

The luminescent component of the second aspect of the present invention provides an excellent photoluminescence quantum yield.

For example, the quantum yield of the solid polymer compositions suggested to be used in the present one or more elements is in total >60%, and preferably >80%, most preferably >90%, preferably when excited by blue light. In addition, owed to the material selection, the crystal size, and the strict separation of LCs of different colors, sharp wavelength distributions can be achieved in the emitted light, such that the quality of the resulting emitted light is superior. Preferably, the FWHM (Full Width at Half Maximum) of the solid polymer composition of each of the elements for visible emissions is <50 nm, preferably, <40 nm, and most preferably <30 nm. For example, an FWHM for the emission peak at 528 nm of 30 nm can be observed, at the same time measuring a high luminescence quantum yield of e.g. 90%. A preferred embodiment of such a solid polymer composition is given in Example 4 below.

As to further specifying optical properties, it is preferred that the component has a haze between 10 and 90%. A haze may be introduced by scattering particles with RI>2.0 and size of 100-1000 nm, or by microstructures or microcrystalline polymer structures or by the elements itself.

Preferably, the luminescent component of any of the preceding embodiments is used for emitting white light in response to the luminescent component being radiated by blue light, in particular as a backlight in a liquid crystal display. For this purpose, a blue light source may be provided in the device for exciting luminescent reactions in the luminescent component. In case the luminescent component comprises first elements emitting red light and second elements emitting green light, together with the blue light emission of the light source, the luminescent component emits white light resulting as a combination of the emission of red and green light in response to an excitation of the luminescent crystals in the first and second element respectively, and from the transmission of the blue light stemming from the light source which blue light is also used to excite the first and the second element. An intensity proportion of the red, green and blue light emitted preferably is in the range of a ⅓ each.

By suitable designing of the elements, the luminescent component may emit any wavelength combination of light.

A third aspect of the invention concerns a luminescent component, comprising a first film comprising a first solid polymer composition according to a first aspect of the invention. The luminescent crystals of the first solid polymer composition emit light with a first wavelength, preferably green light or red light, in response to excitation by light with a shorter wavelength, preferably blue light.

Preferably, a film is defined having at least one of a length and a width—and preferably both—exceeding a height/thickness of the film.

It is preferred that the first film does not spontaneously emit light but does so in response to excitation, and in particular in response to an excitation with light of a wavelength shorter than the wavelength of the light to be emitted in response to the excitation.

In a preferred embodiment of the luminescent component according to the third aspect of the invention, the luminescent crystals of the first solid polymer composition emit red or green light in response to excitation by light with a shorter wavelength, e.g. blue light.

The inventive luminescent component according to an embodiment provides for LCs/QDs having an average size of 3-500 nm, in particular of 3-100 nm.

Preferably, the luminescent crystals of the first solid polymer composition are of size between 3 nm and 100 nm.

In a further preferred embodiment of the third aspect of the invention, the luminescent component comprises the first film, wherein the luminescent crystals of the first solid polymer composition emit red light in response to excitation by light with a shorter wavelength, preferably by blue light. In addition, the luminescent component comprises a second film comprising a second solid polymer composition according to a first aspect of the invention. The luminescent crystals of the second solid polymer composition emit green light in response to excitation by light with a shorter wavelength, preferably by blue light.

Preferably, the luminescent crystals of the second solid polymer composition are of size between 3 nm and 100 nm.

It is preferred that the first and the second film do not spontaneously emit light but do so in response to excitation, and in particular in response to an excitation with light of a wavelength shorter than the wavelength of the light to be emitted in response to the, preferably the same, excitation.

Hence, in a preferred embodiment, the first film emits red light, preferably in response to an excitation with blue light, while the second film emits green light, preferably in response to an excitation with blue light. Red light is considered light with a peak wavelength in the range between 590 nm and 700 nm. Green light is considered light with a peak wavelength in a range between 490 nm and 570 nm.

Such different wavelength spectrum preferably is achieved by selecting a different chemical composition and/or a different size for the luminescent crystals of the second solid polymer composition compared to the luminescent crystals of the first solid polymer composition.

In a preferred embodiment of the third aspect, the red light emitting property of the luminescent crystals of the first solid polymer composition preferably is a result from the proper selection of the material at a defined size constraint by the first aspect of the invention, in particular constraint by formula (I). The green luminescent crystals preferably have a different chemical composition and/or a different size than the red luminescent crystals and are a result from the proper selection of the material at a defined size constraint by the first aspect of the invention, in particular constraint by formula (I).

In a very preferred embodiment, the luminescent crystals of the first solid polymer composition designed for emitting red light show a peak wavelength in the range between 590 nm and 700 nm, preferably with an FWHM between 15 and 50 nm.

In a very preferred embodiment, the luminescent crystals of the second solid polymer composition are designed for emitting green light and show a peak wavelength in the range between 490 nm and 570 nm, preferably with an FWHM between 15 and 50 nm.

Preferably, a concentration of the respective luminescent crystals with respect to a polymer and surfactant matrix of the solid polymer composition per film is within a range of 0.01 wt % and 0.5 wt %, preferably between 0.015 wt % and 0.35 wt %, most preferably between 0.02 wt % and 0.26 wt % for the first film; and between 0.01 wt % and 0.5 wt %, preferably between 0.015 wt % and 0.35 wt %, most preferably between 0.02 wt % and 0.2 wt % for the second film.

In a preferred embodiment, if the luminescent crystals emit red light and are of $FAPbI_3$ a concentration of the luminescent crystals is 0.305 wt %; and if the luminescent crystals are of $FAPbBr_2I$, a concentration of the luminescent crystals is 0.260 wt %.

In a preferred embodiment, if the luminescent crystals emit green light and are of $FAPbBr_3$ a concentration of the luminescent crystals is 0.238 wt %; and if the luminescent crystals are of $FAPbBr_2Cl$, a concentration of the luminescent crystals is of 0.217% wt.

The upper limit of this concentration range supports RoHS compliance on the one hand, while the lower limit of this concentration range provides for a sufficient emission at reasonable film thicknesses of the component on the other hand.

Preferably, a thickness of the first film is between 3 μm and 500 μm more preferably between 5 μm and 100 μm, most preferably between 10 μm and 30 μm and/or a thickness of the second film is between 30 μm and 500 μm preferably between 50 μm and 200 μm, most preferably between 70 μm and 150 μm.

In a further embodiment of the third aspect, the luminescent crystal weight per area of film is between 0.05 g/m2 and 3.0 g/m2, preferably between 0.2 g/m2 and 1.5 g/m2, most preferably between 0.25 g/m2 and 0.7 g/m2. Such amounts of luminescent crystals per film area are favourable to absorb a very high fraction of the excitation light and transform all it to the corresponding higher emission wavelength.

The present luminescent component provides for a spatial separation of the luminescent crystals of the first and the second solid polymer composition. As will be shown in more detail below, the separation may be achieved by means of one or more of a substrate, a gap between the first and second film, and/or an arrangement of the first solid polymer composition in the dedicated first film only and an arrangement of the second solid polymer composition in the dedicated second film only. By doing so, an exchange of cations and anions between the luminescent crystals of the first solid polymer composition and the luminescent crystals of the second solid polymer composition is avoided. Given that the fabrication of each of the first film and the second film preferably is performed in a separate suspension, a mixing of luminescent crystals of the first solid polymer composition of the first film and luminescent crystals of the second solid polymer composition of the second film is avoided. Such mixing instead would result in a conversion of the origin luminescent crystals of the first and second solid polymer composition into different luminescent crystals by way of reaction/recombination based on the above mentioned ion exchange. As a result, such different luminescent crystals would emit light of a different wavelength than the luminescent crystals of the first and second solid polymer composition. Without being bound to theory, due to such an ion exchange reaction a resulting formulation of above red and green luminescent crystals would, depending on the effective compositions of the red and green particles emit a light with a wavelength between the original red and green emission peaks. Instead, the luminescent crystals of the first and the second solid polymer composition are separated at the stage of manufacturing, and hence are added to different portions of the suspension resulting in the above first and second films after hardening/curing/drying. By doing so, the luminescent crystals emitting green light (also referred to as green luminescent crystals) do not interact with luminescent crystals emitting red light (also referred to as red luminescent crystals). Each portion of the suspension preferably comprises the assigned luminescent crystals, optionally a solvent, a surfactant, and a polymer and/or a pre-polymer. Given that the resulting films are solid films, an interaction of the luminescent crystals in the first film with the luminescent crystals in the second film is avoided. In case of an adjacent arrangement of the first film and the second film, such interaction is avoided to a large extent, given that only cations/anions of the QDs residing at the interface of the first and the second film may recombine.

The present luminescent component according to the third aspect of the invention provides an excellent photoluminescence quantum yield.

For example, the quantum yield of the solid polymer compositions suggested to be used in the present films is in total >60%, and preferably >80%, most preferably >90%, preferably when excited by blue light. In addition, owed to the material selection, the crystal size, and the strict separation of the green and the red LCs, sharp wavelength distributions can be achieved in the emitted red and green light respectively, such that the quality of the resulting emitted light is superior. Preferably, the FWHM (Full Width at Half Maximum) of the solid polymer composition of each of the first film and the second film for visible emissions is <50 nm, preferably, <40 nm, and most preferably <30 nm, each in the range of red or green light respectively. For example, an FWHM for the emission peak at 528 nm of 30 nm can be observed, at the same time measuring a high luminescence quantum yield of e.g. 90%. A preferred embodiment of such a solid polymer composition is given in Example 1 below.

As to further specifying optical properties, it is preferred that either one or both of the first and the second film have a haze between 10 and 90%. A haze may be introduced by scattering particles with RI>2.0 and size of 100-1000 nm, or by microstructures or microcrystalline polymer structures.

In a further preferred embodiment of the third aspect, the luminescent component comprises one or more barrier films each having a water vapor transmission rate of less than 0.1 g m$^2$ day$^{-1}$ (determined at a temperature of 38° C. and at 90% relative humidity and atmospheric pressure).

In any of the above and below embodiments, the component may include a barrier film on top of an otherwise exposed surface of the first and/or second film. Such barrier film may in particular have a low water vapour transmission rate in order to avoid a degradation of the LCs in the film/s in response to being exposed to water. The barrier film may in one embodiment be permeable for 02, or, in a different embodiment, may also be impermeable for oxygen. Preferably, the barrier film is transmissive for light. Such barrier film may be present in the form of a single layer or in the form of multilayers. The barrier film might comprise organic polymers and/or inorganic materials.

Preferably, a material of each barrier film is selected from the group consisting of polyvinylidene chlorides, cyclic olefin copolymers, high-density polyethylene, metal oxides, silicon oxide, silicon nitride; optionally in the form of organic/inorganic multilayers.

In a first embodiment, the first film and the second film are attached to each other. No substrate may be required in this embodiment. Barrier films may be attacked to both outside surfaces of the stack of first and second film. The first film, the second film and the two barrier films preferably have the same plane extension, i.e. length and width.

In a preferred embodiment of the third aspect, the luminescent component comprises a substrate, wherein the first film is supported by the substrate, and wherein the second film is supported by the substrate.

In particular the substrate is one of an organic substrate or an inorganic substrate (e.g. glass) and non-opaque, preferably wherein the substrate comprises a polymer, and very preferably wherein the substrate comprises or consists of a polymer selected from the list of polyethyleneterephthalate (PET), Triacetylcellulose (TAO), polyethylene naphthalate (PEN).

Preferably, the substrate might serve as a barrier film, as described above, itself.

Preferably, the substrate is transmissive for light in the visible spectrum, i.e. the substrate is non-opaque. As to further specifying optical properties of the substrate, it is preferred that the substrate has a haze between 10 and 90% that might be introduced as described above.

In an embodiment of the third aspect of the invention, the first film and the second film are both attached to the substrate, and hence, except for a possible bonding or other attachment layer in between, are in direct contact with the substrate.

In a different embodiment, one or both of the first film and the second film may not be in direct contact with the substrate but may be attached to another layer or film which in turn is attached to the substrate. In such arrangement the one or more films are still considered to be supported by the substrate. Such support results in a component, that may be easy to further assemble or that may be robust enough for further handling.

In a preferred embodiment, the thickness of the substrate is in a range between 30 µm and 300 µm, and preferably is between 50 µm and 150 µm.

In one embodiment, the substrate may also act as a barrier film such that an exposed surface of the substrate may not necessarily be covered by a dedicated barrier film. In a different embodiment, however, and in particular when the substrate is transmissive to water, an otherwise exposed surface of the substrate may also be covered by a barrier film.

The term "film" does not necessarily imply that its plane extension defined by its length and width is equal to the plane extension of the substrate defined by its length and width. Each of the first and the second film may in particular show a smaller plane extension than the substrate. However, in another embodiment, each of the first and the second film shows a plane extension equal to the plane extension of the substrate.

In a preferred embodiment, one or more of the first and the second film may comprise scatter particles, such as $ZrO_2$ or $TiO_2$.

In a preferred first class of embodiments, the substrate, the first film and the second film are vertically stacked, i.e. orthogonal to their plane extensions.

In a first of such an embodiment of the luminescent component according to the third aspect, the substrate is arranged between the first film and the second film. Hence, the first and the second films are separated by the substrate.

In a preferred variant, the first film is deposited directly on a first surface of the substrate, e.g. its bottom surface, while the second film is directly deposited on a second surface of the substrate, e.g. its top surface. In a different variant, one or more intermediate layers, in particular of light transmissive property, may be arranged between one or both of the films and the substrate. Any deposition/attachment of the first or second film on the substrate or on each other—the latter will be explained below—may include coating, depositing, laminating, bonding, etc.

Preferably, a first of the barrier films is deposited on the surface of the first film otherwise exposed, and a second of the barrier films is deposited on the surface of the second film otherwise exposed.

Preferably, the first film is arranged between a first of the barrier films and the substrate, and the second film is arranged between a second of the barrier films and the substrate.

In a further preferred embodiment of the luminescent component according to the third aspect, one of the first and the second film is arranged between the substrate and the other of the first and the second film.

Preferably, the first and the second film are arranged between the substrate and the barrier film.

In such an embodiment, the first film is arranged between the substrate and the second film. In a second embodiment, the second film is arranged between the substrate and the first film. In a preferred variant, one of the films is deposited directly on a surface of the substrate, e.g. its top surface, while the other film is directly deposited on the one film. In a different variant, one or more intermediate layers, in particular of light transmissive property, may be arranged between the one film and the substrate, and/or between the one film and the other film. Preferably, the otherwise exposed surface of the first or second film may be covered by a barrier film. In one embodiment, the otherwise exposed surface of the substrate may also be covered by another barrier film.

In the above embodiments, it is preferred that the planar extension of the substrate, the first and the second film, and the one or more barrier films if any, is the same. In this respect, the luminescent component may also be considered as a layered structure, a film made from multiple individual films, a foil, etc.

In case of the luminescent component serving as a backlight film for a liquid crystal display, such rectangular component may have a planar extension with a diagonal of more than 3 inches, e.g. for displays of handhelds, or preferably with a diagonal of more than 15 inches for computer displays or TVs. Although the above requires a rectangular plane extension of each of the substrate if any, the first film and the second film, it is emphasized that the scope is not limited to rectangular components. A component may also take a different basic shape, such as a shape of a circle, an ellipse, etc.

In a second class of embodiments, the substrate, the first film and the second film are not all vertically stacked, but the first film and the second film are preferably arranged on the same vertical level, i.e. they are arranged next to each other laterally in the plane of extension of the component. Preferably, both the first film and the second film are arranged on a common surface of the substrate, e.g. its top surface. In a different variant, one or more intermediate layers, in particular of light transmissive property, may be arranged between the substrate and each of the first and the second film. It is noted that the size of each individual piece of the first or second film preferably is below a size that is detectable by eye in the final application (comparable to the pixel size in LCD screens).

In such an embodiment of the luminescent component according to the third aspect, the first film and the second film are arranged on a common surface of the substrate, wherein the first film and the second film are arranged spaced or adjacent.

If the first and second film are arranged spaced, a gap is preferably provided laterally between the first film and the second film. The gap may be filled by air or a different gas, or may be filled by a solid such as a polymer. Hence, the first and the second film are separated from each other, thereby not allowing any recombination between the luminescent crystals of the first and the second solid polymer composition.

If the first film and the second film are arranged adjacent, the first film and the second film are preferably in contact with each other, and in particular are in contact at their side surfaces.

Preferably, the first film and the second film are arranged between the substrate and the barrier film.

Any of above embodiments of the component, and in particular of the embodiments of the second class are not limited to a single first film and a single second film.

Preferably, the luminescent component comprises multiple first films of the first solid polymer composition, and multiple second films of the second solid polymer composition. The multiple first films and the multiple second films are arranged on the common surface of the substrate.

Preferably, the multiple first films and the multiple second films are arranged between the substrate and the barrier film.

Preferably, the multiple first films and the multiple second films are arranged alternating on the common surface of the substrate in one of a spaced or an adjacent arrangement.

In one embodiment, each of the first and second film may take the shape of a stripe having a length equal to the length of the substrate, and a width less than the width of the substrate, and preferably less than a tenth of the width of the substrate and most preferably less than 1 mm, such that multiple first film stripes and second film stripes can be arranged in alternating fashion on the substrate. In a different embodiment, the multiple first and second films may be arranged in form of a two dimensional array on the substrate. For example, the substrate may be covered by alternating first film type rectangles/circles and second film type rectangles/circles, either in spaced relation, or in contact. Any such arrangement may in particular be beneficial when the plane extension of the component is rather large, e.g. when the component is supposed to be used in a display, since in terms of the generation of white background light it may be preferred not to generate red light only at one end of the underlying substrate and green light on the other end, but intermingle red and green light sources represented by the corresponding films.

Any of the embodiments of the second class may include a barrier film covering the otherwise exposed surfaces of the first and second films. In addition, the otherwise exposed surface of the substrate may be covered by another barrier film.

In a preferred embodiment when the first film is in direct contact with the second film the polymer of the first solid polymer composition of the first film differs from the polymer of the second solid polymer composition of the second film in order to avoid potential intermixing of the first film with the second film.

In a further preferred embodiment, when the first film is not in direct contact with the second film, the polymer of the first solid polymer composition of the first film is identical with the polymer of the second solid polymer composition of the second film. Preferably, also the surfactant of the first solid polymer composition of the first film is identical with the second solid polymer composition of the second film.

The hardened/cured polymer preferably is light transmissive, i.e. non-opaque for allowing light emitted by the luminescent crystals, and possible light of a light source used for exciting the luminescent crystals to pass.

In a further preferred embodiment of the luminescent component according to the third aspect, the first film comprises luminescent crystals of the first solid polymer composition only and is free from luminescent crystals of the second solid polymer composition. The second film comprises luminescent crystals of the second solid polymer composition only and is free from luminescent crystals of the first solid polymer composition. The first film comprises luminescent crystals of the first solid polymer composition only and is free from any other luminescent crystals. The second film comprises luminescent crystals of the second solid polymer composition only and is free from any other luminescent crystals.

By these means, the first film is dedicated to solely emitting red light in response to an excitation, but no green light or light of a different color, respectively, while the second film is dedicated to solely emitting green light in response to an excitation, but no red light or light of a different color, respectively. This concept may hold for any first film in case of multiple first films, and for any second film in case of multiple second films.

In a preferred embodiment, the device represents a backlight film for a liquid crystal display for emitting white light. For this purpose, a blue light source may be provided in the device for exciting luminescent reactions in the first and the second film. In case the substrate is of light transmissive property for light in the visible spectrum, the luminescent component emits white light resulting as a combination of the emission of red and green light in response to an excitation of the luminescent crystals in the first and second film respectively, and from the transmission of the blue light stemming from the light source which blue light is also used to excite the first and the second film. An intensity proportion of the red, green and blue light emitted preferably is in the range of a $\frac{1}{3}$ each.

A concurrent high quantum yield, RoHS compliance, a stable peak position and narrow FWHM in the emitted spectrum, and a high stability represents a major achievement of the invention of the second aspect and of the third aspect over the state of the art. Conventionally, CdSe or InP materials were suggested for LCs. However, while the first provides a sufficient quantum yield, RoHS compliance is challenging and often relies on regulatory exemptions. The latter on the other hand is RoHS compliant but shows inferior optical qualities (quantum yield<60%; FWHM>40 nm). In contrast, the component of the present inventions according to the second and third aspect provide both, a good quantum yield, low peak FWHM and RoHS conformity. This is achieved by selecting appropriate materials for LCs, applying appropriate LC concentrations in the component and by selecting appropriate component dimensions/thicknesses and at the same time arranging the different LCs such that they are separated from each other to avoid ion exchange reactions. Avoiding ion exchange reaction is in particular important in a luminescent component, wherein the first solid polymer composition of the first film touches the second solid polymer composition of the second film.

In particular, the luminescent component according to the second or third aspect is an intermediate good that is assembled together with other components into a device, such as an optical device, and preferably into one of a Liquid Crystal Display (LCD), a Light Emitting Diode (LED), an Organic Light Emitting Diode (OLED), an OLED display, or a solar cell. As part of an OLED, LED or LCD, the component may contribute to a display of a mobile or stationary computing, telecommunication, or television device.

The luminescent component of the second or third aspect is in particular comprised in a light emitting device according to a fourth aspect of the invention.

A fourth aspect of the invention concerns a light emitting device, comprising a luminescent component according to the second or the third aspect of the invention and a light source for emitting blue light. The light source is arranged for exciting the luminescent component. The light emitting device is one of a Liquid Crystal Display (LCD), an Organic Light Emitting Diode (OLED) or a Light Emitting Diode (LED).

Blue light is considered to have a wavelength in a range between 400 and 490 nm.

The light source is arranged for exciting the luminescent component. Accordingly, the device is prepared to emit light of wavelengths which are defined by the luminescent crystals of the respective luminescent component.

Preferably, the light source is an LED chip. In one embodiment, the luminescent component preferably is arranged to at least partly enclose the LED chip. In another embodiment, the luminescent component preferably is arranged distant from the LED chip. In such embodiment, the LED chip preferably is at least partly covered by a phosphor-free encapsulation.

The term "phosphor" is known in the field and denotes a substance showing the phenomenon of luminescence. This can either be phosphorescence or fluorescence. These materials are often used in solid state lighting applications where blue LED light is transformed into a white light by adding the right amount and type of phosphors such as doped yttrium aluminum oxides.

In yet another embodiment of this invention the light source is an OLED stack. In this case, the luminescent component is preferably arranged to cover the whole OLED stack or at least parts of it.

The present invention will be described in more detail below. It is understood that the various embodiments, preferences and ranges as provided/disclosed in this specification may be combined at will. Further, depending of the specific embodiment, selected definitions, embodiments, or ranges may not apply.

BRIEF DESCRIPTION OF THE DRAWINGS

The invention will be better understood and objects other than those set forth above will become apparent from the following detailed description of embodiments thereof. Such description makes reference to the annexed drawings, wherein:

FIG. 2 illustrates a light emitting device according to an embodiment of the fourth aspect of the present invention;

FIGS. 5 to 7 each shows a perspective view of a luminescent component according to an embodiment of the third aspect of the present invention;

FIG. 8 illustrates a schematic block diagram of a light emitting device according to an embodiment of the third aspect of the present invention;

DETAILED DESCRIPTION OF THE DRAWINGS

Figure 1A:
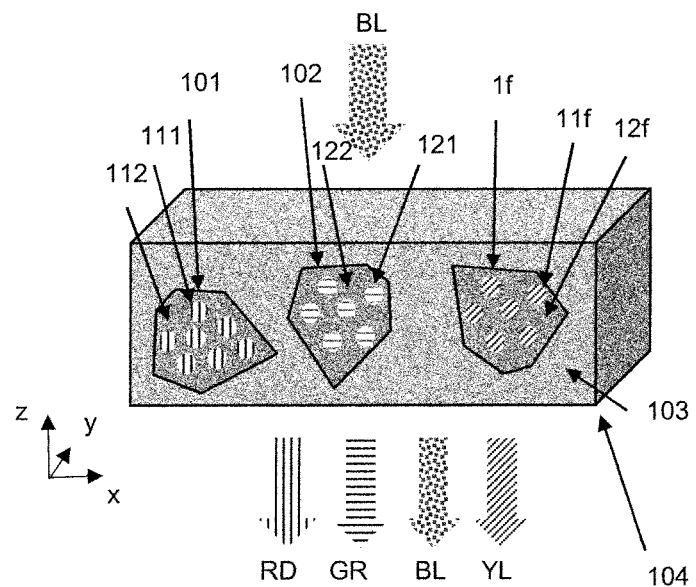
FIG. 1a illustrates a schematic perspective view of a luminescent component according to an embodiment of the second aspect of the present invention.

FIG. 1a illustrates a schematic perspective view of a luminescent component according to an embodiment of the second aspect of the present invention. The luminescent component 104 comprises an encapsulation 103, e.g. made from a non-opaque polymer. In the present embodiment, the encapsulation 103 is of a thin film shape whereby the length (x-axis) and width (y-axis) are of much greater size than the thickness in z-direction. However, the encapsulation 103 may take a different shape if needed.

First elements 101, second elements 102, and first further elements if are embedded in the encapsulation 103, only one of each is shown in a cut mode in FIG. 1a.

The first element 101 comprises a first solid polymer composition comprising luminescent crystals 111, a polymer 112 and surfactants. The luminescent crystals 111 of the first solid polymer composition are selected from compounds of formula (I) introduced above. These luminescent crystals 111 have a size between 3 nm and 500 nm. In response to excitation by blue light BL as indicated by the arrow, these luminescent crystals 111 emit red light RD, for example.

The second element 102 comprises a second solid polymer composition comprising luminescent crystals 121, a polymer 122, and surfactants. The luminescent crystals 121 of the second solid polymer composition are selected from compounds of formula (I) introduced above. These luminescent crystals 221 have a size between 3 nm and 500 nm. In response to excitation by the blue light BL, these luminescent crystals 121 emit green light GR, for example.

Generally, different further elements nf with n∈[1,N] may be comprised in the encapsulation 103 including a first further element 1f, preferably a second further element 2f, . . . an Nth further element Nf. Each further element nf comprises a further solid polymer composition comprising luminescent crystals n1f, a polymer n2f, and surfactants.

Presently, only first further elements 1f are included in the encapsulation 103. Each first further element if comprises luminescent crystals 11f, a polymer 12f and surfactants. The luminescent crystals 11f of the first further elements 1f are selected from compounds of formula (I) introduced above. These luminescent crystals 11f have a size between 3 nm and 500 nm. In response to excitation by the blue light BL, these luminescent crystals 11f emit yellow light YL, for example.

In one embodiment of the invention there can also be multiple further elements nf emitting multiple different colors.

The luminescent crystals of the first, second and further solid polymer component 111, 121, n1f are separated from each other by means of the separated elements 101, 102, nf. In this embodiment, the encapsulation 103 builds the separation. Hence, the first, second and further luminescent elements 101, 102, nf are stable, also in a long-term.

As is indicated in FIG. 1a, once such luminescent component is exposed to radiation of a shorter wavelength than the emitted wavelength, and in particular to blue radiation BL, the luminescent crystals of the first, second and first further solid polymer composition 111, 121, 11f are excited and emit red, green and yellow light RD, GR, YL, respectively. Together with a portion of the blue light BL passing the luminescent component 104 the output of the luminescent component is a mixture of these colors and can be tuned by the amount of first, second and first further elements 101, 102, 11f in the luminescent component.

In case the luminescent component 104 of FIG. 1a comprises first and second elements 101 and 102 emitting red and green light only, the luminescent component 104 may in combination with a light source emitting the blue light BL represent a backlight film that can be used in an LCD given that the combination of red, green and blue light emitted result in white light. An intensity proportion of the red, green and blue light emitted preferably is in the range of a ⅓ each.

Figure 1B:
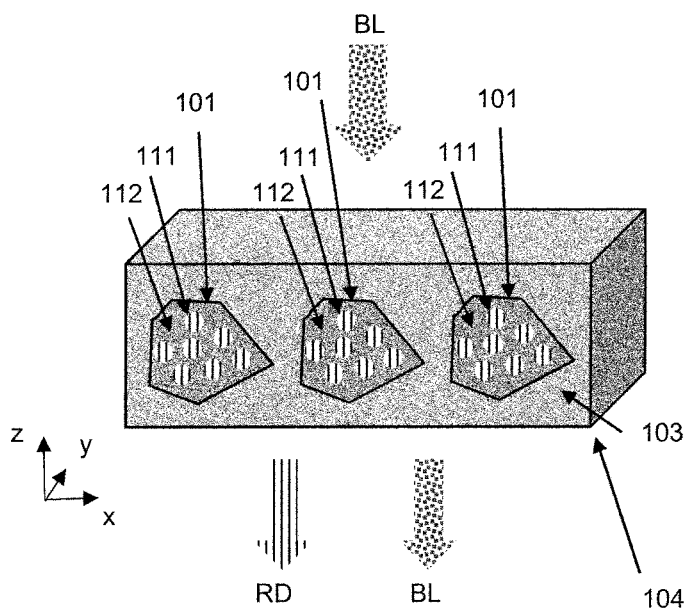
FIG. 1b illustrates a schematic perspective view of a luminescent component according to a further embodiment of the second aspect of the present invention.

FIG. 1b illustrates a schematic perspective view of a luminescent component 104 according to an embodiment of the second aspect of the invention as shown in FIG. 1a. The embodiment of FIG. 1b distinguishes from the embodiment of FIG. 1a in that the luminescent component 104 comprises multiple first elements 101 only that are embedded in the encapsulation 103. The first elements 101 comprise each luminescent crystal of the first solid polymer composition only.

Figure 1C:
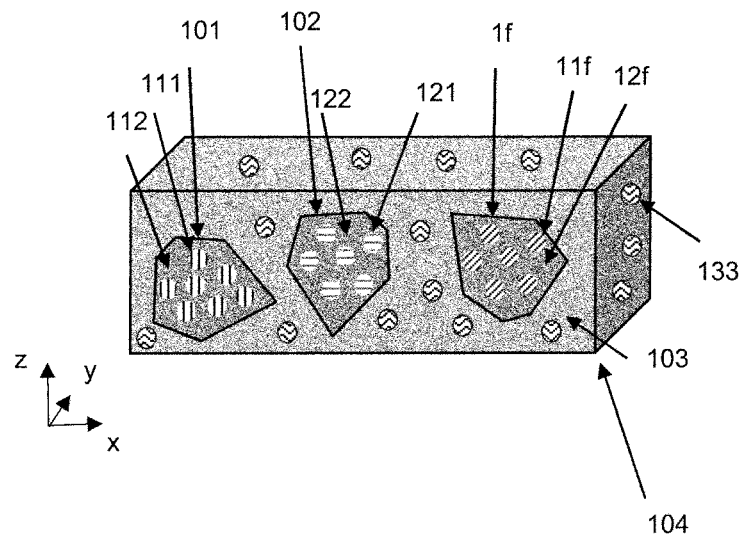
FIG. 1c illustrates a schematic perspective view of a luminescent component according to a further embodiment of the second aspect of the present invention.

FIG. 1c illustrates a schematic perspective view of a luminescent component 104 according to a further embodiment of the second aspect of the invention. The encapsulation 103 of this further embodiment comprises additional luminescent crystals 133.

These luminescent crystals 133 are of different chemical composition and/or size than the luminescent crystals 111 of the first solid polymer composition and emit light of a wavelength different to the first wavelength in response to excitation by light with a wavelength shorter than the first wavelength.

In addition, the luminescent crystals 133 enclosed by the encapsulation 103 might be different in composition and/or in size to the luminescent crystals 121 of the second and or/to the luminescent crystals (11f) of the first further solid polymer composition.

The additional luminescent crystals 133 might emit light of a wavelength different to the second and/or further wavelength in response to excitation by light with a wavelength shorter than each of the first, second and/or further wavelength.

FIG. 2 illustrates a light emitting device according to an embodiment of the fourth aspect of the invention comprising a luminescent component according to the second aspect of the invention. The light emitting device presently is a Light Emitting Diode LED. The device includes a luminescent component 104 of a sphere-like shape. As is indicated in FIG. 2, the luminescent component 104 includes multiple first elements 101. Each first element 101 includes luminescent crystals of the first solid polymer composition in addition to a polymer and surfactants, but no other luminescent crystals. The first elements 101 are embedded in the encapsulation 103 separate from each other, which encapsulation 103 is transmissive to light. Subject to the application of the resulting device other elements configured to emit light of one or more different wavelengths than the first elements may be incorporated in the encapsulation.

Reference numeral 5 indicates an LED chip as a light source that is arranged on a carrier 6. The luminescent component 104 partly encloses—the top and the sides of—the LED chip 5. The LED chip 5 preferably is configured to emit blue light. In response to an excitation by blue light emitted from the LED chip 5, the luminescent crystals in the first elements 101 and/or further elements of the luminescent component 104 emit light of a different colour, e.g. red, green and/or yellow light. Hence, the present embodiment schematically illustrates an LED emitting e.g. additive colour mixtures of red and/or green and/or yellow with LED chip 5 blue light. As to the manufacturing of the device of FIG. 2, the LED chip 5 may be preassembled onto the carrier 6, and the luminescent component 104 may be dropped onto the LED chip 5/carrier 6 arrangement in liquid form, and then be hardened, cured or dried.

In view of the luminescent component 104 being arranged directly on the LED chip 5, the luminescent component 104 preferably includes heat resistant materials. For example, the polymer in the first elements 101 and the encapsulation 103 may be a temperature stable polymer, and preferably may be Silicone or Polysilazane.

Figure 3:
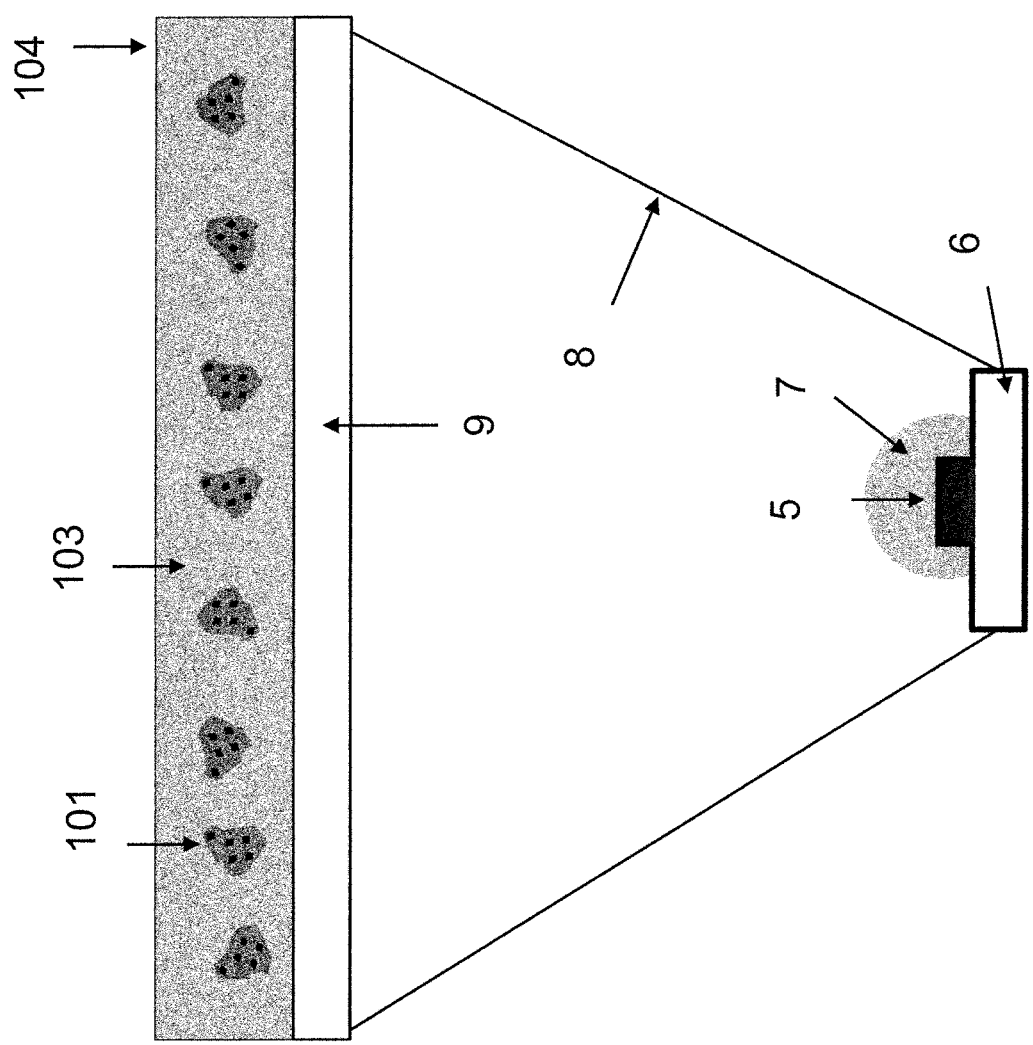
FIG. 3 illustrates a light emitting device according to another embodiment of the fourth aspect of the present invention.

FIG. 3 illustrates a light emitting device according to another embodiment of the fourth aspect of the present invention comprising a luminescent component according to the second aspect of the invention. The light emitting device presently is a Light Emitting Diode LED. The device includes a luminescent component 104 of a film-like shape. As is indicated in FIG. 3, the luminescent component 104 includes multiple first elements 101. Each first element 101 includes luminescent crystals of a first solid polymer composition in addition to a polymer and surfactants but no other luminescent crystals. The first elements 101 are embedded in the encapsulation 103 separate from each other, which encapsulation 103 is transmissive to light. Subject to the application of the resulting device other elements configured to emit light of one or more different wavelengths than the first elements 101 may be incorporated in the encapsulation 103.

The luminescent component 104 is arranged on a transparent plate 9, e.g. of a housing or a front. The luminescent component 104/plate 9—combination is arranged distant from an LED chip 5 acting as a light source that is arranged on a carrier 6. The distant arrangement may be achieved by means of a housing 8. The LED chip 5 preferably is configured to emit blue light. Presently, the LED chip 5 is partly enclosed by a phosphor-free enclosure 7. In response to an excitation by blue light emitted from the LED chip 5, the luminescent crystals in the first elements 101 and/or further elements of the luminescent component 104 emit light of a different colour, e.g. red, green and/or yellow light. Hence, the present embodiment schematically illustrates an LED emitting e.g. additive colour mixtures of red and/or green and/or yellow with LED chip 5 blue light. As to the manufacturing of the device of FIG. 3, the LED chip 5 may be preassembled onto the carrier 6, while the luminescent component 104 may in its hardened form be attached to the plate 9.

In contrast to the embodiment illustrated in FIG. 2, the luminescent component is arranged distant form the LED chip 5 such that the luminescent component may not be required to stand heat in the same way.

Figure 4:
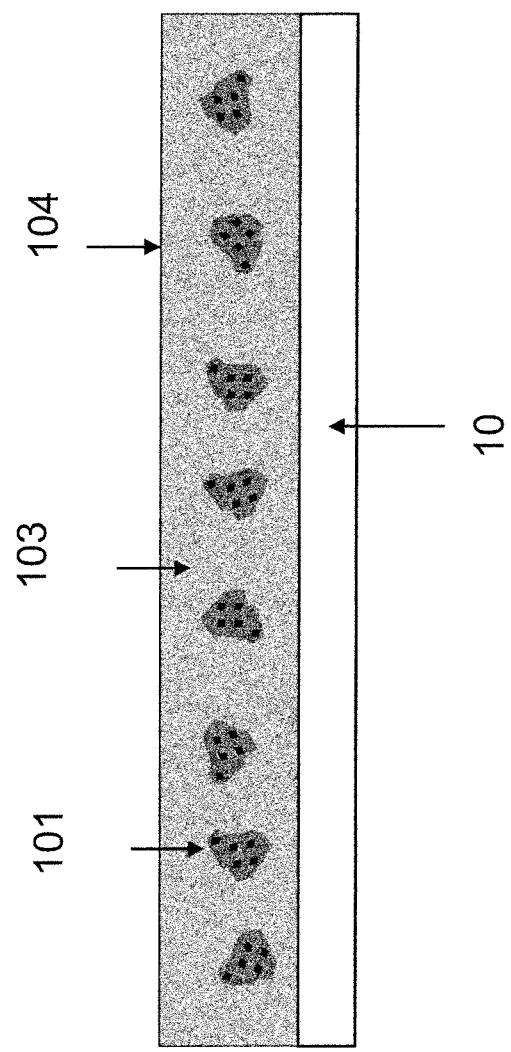
FIG. 4 illustrates a light emitting device according to another embodiment of the fourth aspect of the present invention.

FIG. 4 illustrates a light emitting device according to an embodiment of the fourth aspect of the present invention comprising a luminescent component according to the second aspect of the present invention. The light emitting device presently is an Organic Light Emitting Diode OLED. The device includes a luminescent component 104 of flat shape. As is indicated in FIG. 4, the luminescent component 104 includes multiple first elements 101. Each first element 101 includes luminescent crystals of a first solid polymer composition in addition to a polymer and surfactants, but no other luminescent crystals. The first elements 101 are embedded in the encapsulation 103 separate from each other, which encapsulation 103 is transmissive to light. Subject to the application of the resulting device other elements configured to emit light of one or more different wavelengths than the first elements may be incorporated in the encapsulation.

Reference numeral 10 indicates an OLED stack as a light source that may be arranged on further carrier. The OLED stack 10 preferably is configured to emit blue light. In response to an excitation by blue light emitted from the OLED stack 10, the luminescent crystals in the first elements 101 and/or further elements of the luminescent component 104 emit light of a different colour, e.g. red, green and/or yellow light. Hence, the present embodiment schematically illustrates an OLED device emitting e.g. additive colour mixtures of red and/or green and/or yellow. As to the manufacturing of the device of FIG. 4, the OLED stack 10 may be preassembled onto a carrier, and the luminescent component 104 may be coated onto the OLED stack 10 in liquid form, and then be hardened, cured or dried.

FIG. 5 illustrates a perspective view of a luminescent component according to an embodiment of a third aspect of the present invention. The luminescent component comprises a substrate 203, e.g. made from a non-opaque polymer or a non-opaque inorganic material such as glass. The substrate 203 has a top surface TS and a bottom surface BS opposite the top surface TS.

A first film 201 is attached to the top surface TS of the substrate 203. A second film 202 is attached to the bottom surface BS of the substrate 203. The attachment may be achieved e.g. by bonding or by directly casting the respective film onto the substrate 203. Each of the first film 201, second film 202 and substrate 203 has a length along the x-axis, a width along the y-axis, and a thickness along the z-axis.

The following description of characteristics of the first and the second film 201, 202 are applicable to all other embodiments introduced in this section.

The first film 201 comprises a first solid polymer composition. The first solid polymer composition at least comprises a polymer, surfactants, and luminescent crystals 211, wherein these luminescent crystals 211 are selected from compounds of formula (I) as defined herein.

The luminescent crystals 211 of the first solid polymer composition have a size between 3 nm and 500 nm. In response to excitation, these luminescent crystals 211 emit red light.

The second film 202 comprises a second solid polymer composition. The second solid polymer composition comprises at least a polymer, surfactants, and luminescent crystals 221. The luminescent crystals 221 of the second solid polymer composition are selected from compounds of formula (I) as defined herein.

The luminescent crystals 221 of the second film have a size between 3 nm and 500 nm. In response to excitation, the luminescent crystals 221 of the second film emit green light.

The polymer of the first and the second solid polymer composition are preferably but not necessarily the same. The surfactants of the first and the second solid polymer composition are preferably but not necessary the same.

As can be derived from FIG. 5, it is preferred that both the first and the second film 201, 202 extend all across the top and respective bottom surface TS, BS of the substrate 203. Hence, the footprint of the substrate 203 can fully be exploited.

The luminescent crystals 211 of the first solid polymer composition and the luminescent crystals 221 of the second solid polymer composition are separated from each other. In this embodiment, the substrate 203 builds the separation. Hence, the first and second films 201, 202 are stable, also in a long-term. It is preferred—which feature is also true for any of the other embodiments—that the first film 201 exclusively comprises the luminescent crystals 211 of the first solid polymer composition emitting red light when excited, such that preferably there are no luminescent crystals 221 of the second solid polymer composition present in the first film 201, nor any other than the luminescent crystals 211 of the first solid polymer composition. Accordingly, it is preferred,—which feature is also true for any of the other embodiments—that the second film 202 exclusively comprises the luminescent crystals 221 of the second solid polymer composition emitting green light when excited, such that preferably there are no luminescent crystals 211 of the first solid polymer composition present in the second film 202, nor any other than the luminescent crystals 221 of the second solid polymer composition.

As is indicated in FIG. 5, once such luminescent component is exposed to radiation, and in particular to blue radiation BL, the luminescent crystals of the first and second solid polymer composition 211 and 221 are excited and emit red and green light RD, GR respectively. Together with a portion of the blue light BL passing the luminescent component the output of the luminescent component is white light. Hence, the present device can preferably be used as a backlight illumination in an LCD, for example.

FIG. 6 illustrates a perspective view of a luminescent component according to another embodiment of the third aspect of the present invention. Again, the luminescent component comprises a substrate 203 and a first and a second film 201, 202. The first film 201 preferably comprises luminescent crystals 211 of the first solid polymer composition only while the second film 202 preferably comprises luminescent crystals 221 of the second solid polymer composition only. Again, the first and the second films 201 and 202 fully extend across a surface of the substrate 203. In contrast to FIG. 5, however, the first and the second films 201 and 202 are not arranged on different sides of the substrate 203, but are arranged at the same side of the substrate 203 on top of each other. Preferably, in such an embodiment, the substrate 203 might also act as a barrier film or might be formed as a barrier film 203 itself. Hence, a stack built from the first and the second film 201 and 202 is deposited on a surface of the substrate 203, e.g. the bottom surface BS. This stack may also be divided by a layer of a different solid polymer composition. In the example shown in FIG. 6, the first film 201 is attached to the bottom surface BS of the substrate 203, while the second film 202 is arranged on bottom of the exposed surface of the first film 201. In a different arrangement, the second film 202 is attached to the bottom surface BS of the substrate 203 while the first film 201 is attached to the exposed surface of the second film 202. Of course, when it comes to manufacturing the luminescent component, the films may be attached in sequence to the substrate 203. In a different embodiment, the first and the second films 201, 202 are attached to each other forming a stack prior to attaching the stack to the substrate 203.

FIGS. 7 and 8 illustrate perspective views of luminescent components according to further embodiments of the third aspect of the present invention. Instead of providing only a single first film 201 and a single second film 202 such as in the embodiments of FIGS. 5 and 6, multiple first films 201 and multiple second films 202 are provided, wherein the number of two films per type is only exemplary. Instead of arranging the first and second films 201, 202 on different levels, i.e. on different vertical (z-) positions such as in the embodiments of FIGS. 5 and 6, the luminescent films 201 and 202 are arranged in the same level on the z-axis. Hence, the first and the second films 201 and 202 are arranged next to each other in the same plane, and, as a result, the first and the second film 201, 202 are both arranged on a common surface of the substrate 203, e.g. its bottom surface BS. In the embodiment of FIG. 7, the first and second films 201 and 202 are arranged alternating and in contact with each other, while in the embodiment of FIG. 8, the first and second films 201 and 202 are arranged alternating and separated from each other by air gaps. It is noted that the spatial arrangement preferably is in such a small size that it is not visible by eye in the final application.

Figure 9:
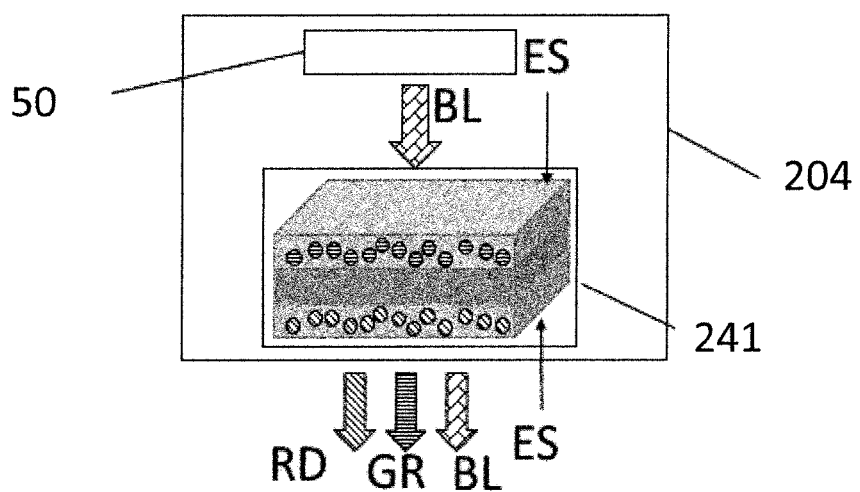
FIG. 9 illustrates a schematic block diagram of a light emitting device according to an embodiment of the fourth aspect of the present invention.

FIG. 9 illustrates a schematic block diagram of a light emitting device 204 according to an embodiment of the fourth aspect of the present invention comprising a luminescent component according to the third aspect of the present invention. The device 204 includes a luminescent component 241 according to FIG. 5, and a light source 50 for emitting blue light, the light source 50 being arranged such that the emitted blue light excites the luminescent component 241. Preferably, the light source 50 is embodied as an element of the same length and width as the first and second film 201,202, and is attached to the luminescent component 241.

In any of the embodiments of the luminescent components of FIGS. 5 to 9, otherwise exposed surfaces ES of the first or second film 201 or 202 are preferably covered by a barrier film for protecting the luminescent crystals in the respective films 201 and 202. Preferably, such one or two barrier films fully extend across the otherwise exposed surface, but not necessarily across side surfaces of the first or second films 201, 202 represented by the thickness of the subject films 201, 202, along the z-direction.

Figure 10:
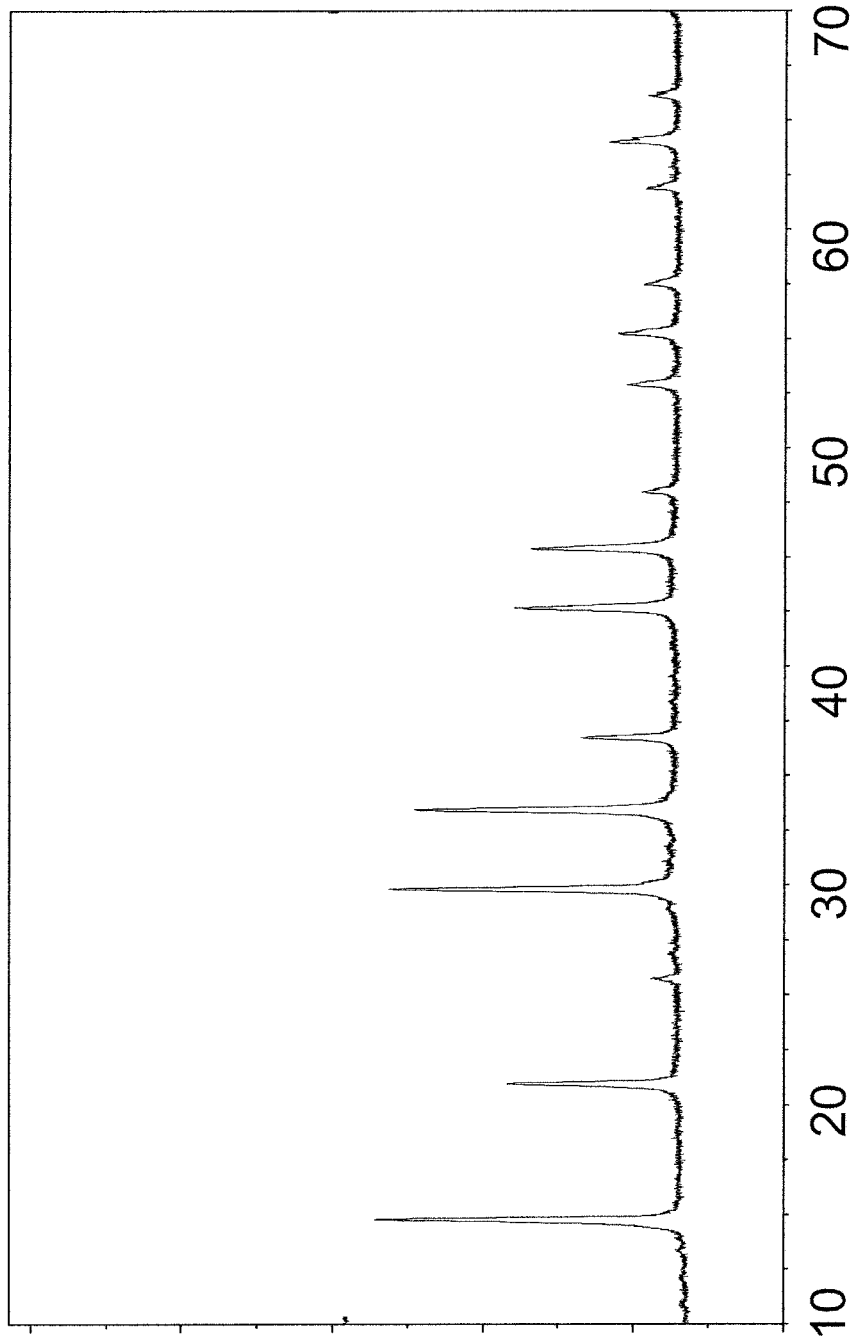
FIG. 10 shows an X-ray diffraction pattern of a preferred starting material $FAPbBr_3$.

FIG. 10 shows an X-ray diffraction pattern (measurement tool: MiniFlex 600, Rigaku) of the starting material FAPbBr$_3$ according to Example 1. X-axis: 2theta (°); y axis: intensity (arbitrary units).

To further illustrate the invention, the following examples are provided. These examples are provided with no intend to limit the scope of the invention Example 1: Synthesis of a Polymer Film with Green Luminescent Crystals Formamidinium lead tribromide (FAPbBr$_3$) was synthesized by milling PbBr$_2$ and FABr. Namely, 16 mmol PbBr$_2$ (5.87 g, 98% ABCR, Karlsruhe (DE)) and 16 mmol FABr (2.00 g, Dyesol, Queanbeyan, (AU)) were milled with Yttrium stabilized zirconia beads (5 mm diameter) for 6 h to obtain pure cubic FAPbBr$_3$, confirmed by XRD (X-ray diffraction; FIG. 10, bottom spectrum). This material did not show any luminescence. The hydrodynamic particle size distribution (volume weighted) was obtained by centrifugal sedimentation method (LUMiSizer, LUM GmbH, Berlin (DE)) mixing 12 mg of powder with 10 ml of S20 Viscosity Oil Standard (PSL Rheotek, Essex (UK)) and using a 2 mm polyamide cuvette. An average particle size (D50) of 7 µm and a size range (D10-D90) of 1-12 µm resulted. The average particle size is defined by the average particle diameter by mass, wherein e.g. D10, D50, and D90 denote the particle size where 10%, 50%, and 90% respectively of the cumulative mass of the distribution is observed.

The orange FAPbBr$_3$ powder was added to Oleic acid (90%, Sigma Aldrich, Missouri (US)), Oleylamine (80-90, Acros Organics, Geel (BE)) (FAPbBr$_3$:Oleic acid:Oleylamine=2:1:1) and Cyclohexane (>99.5%, puriss, Sigma Aldrich). The final concentration of FAPbBr$_3$ was 1 wt %. The mixture was then dispersed by ball milling using Yttrium stabilized zirconia beads with a diameter size of 200 µmat ambient conditions (if not otherwise defined, the atmospheric conditions for all experiments are: 35° C., 1 atm, in air) for a period of 1 h yielding an ink with green luminescence.

Analysis: Luminescent properties of the ink were measured in a 10 mm quartz cuvette (3 µl of the ink diluted in 3 ml of toluene) with a spectrofluorimeter equipped with an integrating sphere (Quantaurus Absolute PL quantum yield measuring system C1134711, Hamamatsu). The photoluminescence quantum yield (PLQY) of above ink was 97% with an emission peak centered at 522 nm (=peak position, PP). The FWHM of the emission was determined as 42 nm.

Film formation: The green emitting ink was then mixed with 10% cyclic olefin copolymer solution in toluene, coated on a glass substrate and dried at 60° C. for 15 minutes. After drying the resulting optical properties of film were measured with a spectrofluorimeter equipped with an integrating sphere (Quantaurus Absolute PL quantum yield measuring system C1134711, Hamamatsu, Hamamatsu (JP)).

Analysis: The photoluminescence quantum yield of the film was 90% with an emission peak centered at 528 nm. The FWHM was determined as 30 nm. The resulting film was subjected to a degradation test for 2 h with increased temperature in a drying oven (80° C., ambient humidity). The photoluminescence quantum yield of the film after degradation was 79% with an emission peak centered at 527 nm. The FWHM was determined as 30 nm.

Conclusion: This example shows the effectiveness of luminescent crystals of formula (I) implemented into a solid polymer composition.

Example 2: Synthesis of a Polymer Film with Red Luminescent Crystals

Step (a): Commercial formamidinium iodide (>99%, Dyesol) and $PbI_2$ (98.5%, Alfa Aesar, Massachusetts (US)) were mixed in equal molar ratio leading to a net stoichiometric composition of $FAPbI_3$. The powder mixture was dry-milled using Yttrium stabilized zirconia beads with a size of 5 mm at ambient conditions for a period of 400 min, and subsequently dried at 80° C.

Step (b): The salt mixture was added to oleylamine (80-90%, Acros Organics) and oleic acid (90%, Sigma Aldrich) ($CsPbBr_3$:Oleylamine:oleic acid=2:1:1) in cyclohexane 99%, Sigma Aldrich). The final concentration of $FAPbI_3$ was 1% wt. The mixture was then dispersed by ball milling using Yttrium stabilized zirconia beads with a size of 200 µm at ambient conditions for a period of 60 min yielding an ink with red luminescence. Film sample was prepared analogous to the procedure in Example 1.

Analysis: The photoluminescence quantum yield of above polymer film was 71% with an emission peak centered at 758 nm. The FWHM of the emission was determined as 89 nm.

Conclusion: This result shows how to obtain a red emitting solid polymer composition comprising $FAPbI_3$.

Example 3: Thermal Stability Comparison of Organic, Inorganic and Organic-Inorganic Solid Polymer Compositions in the Form of a Film Synthesis: The following compositions of material were obtained by the same dry milling method as described in Example 1 or 2: $CsPbBr_3$, $Cs_{0.85}FA_{0.15}PbBr_3$, $Cs_{0.5}FA_{0.5}PbBr_3$, $Cs_{0.15}FA_{0.85}PbBr_3$. Luminescent inks and films were prepared analogous to the procedure described in Example 2.

Analysis: XRD revealed no peaks of the solid material (dry milled starting material) CsBr, FABr nor $PbBr_2$ corroborating the formation of a single phase of mixed cations in the crystal lattice.

Centrifugal sedimentation method (LUMiSizer, LUM GmbH) showed similar hydrodynamic size distribution for all materials with D10 between 0.8-2 µm, D50 between 1-12 µm, and D90 between 4-35 µm.

Figure 11:
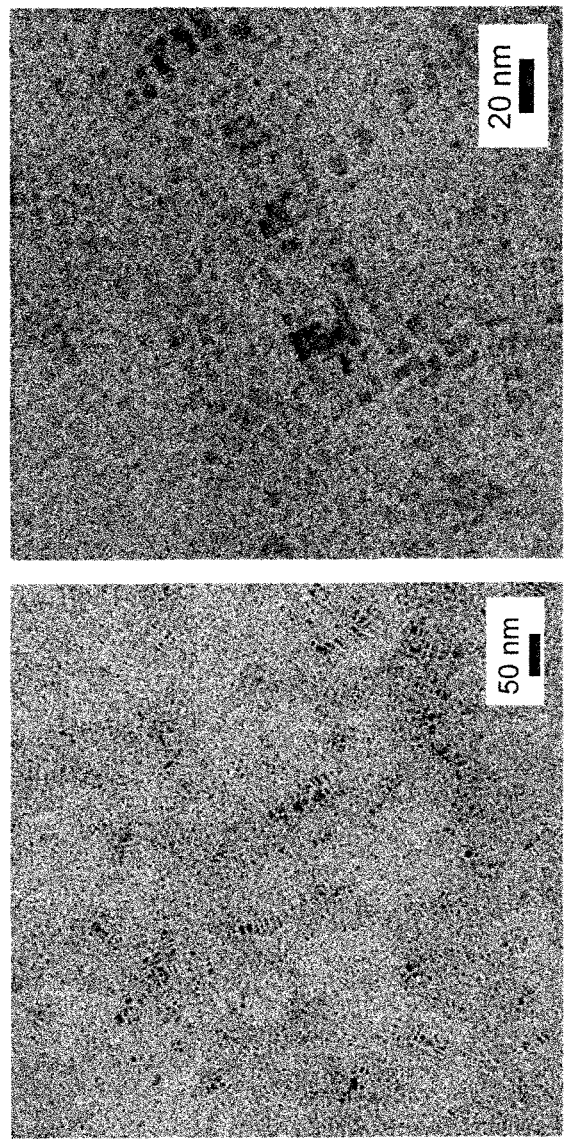
FIG. 11 shows a TEM image of $FAPbBr_3$ luminescent crystals for a solid polymer composition according to an embodiment of the present invention.
Figure 12:
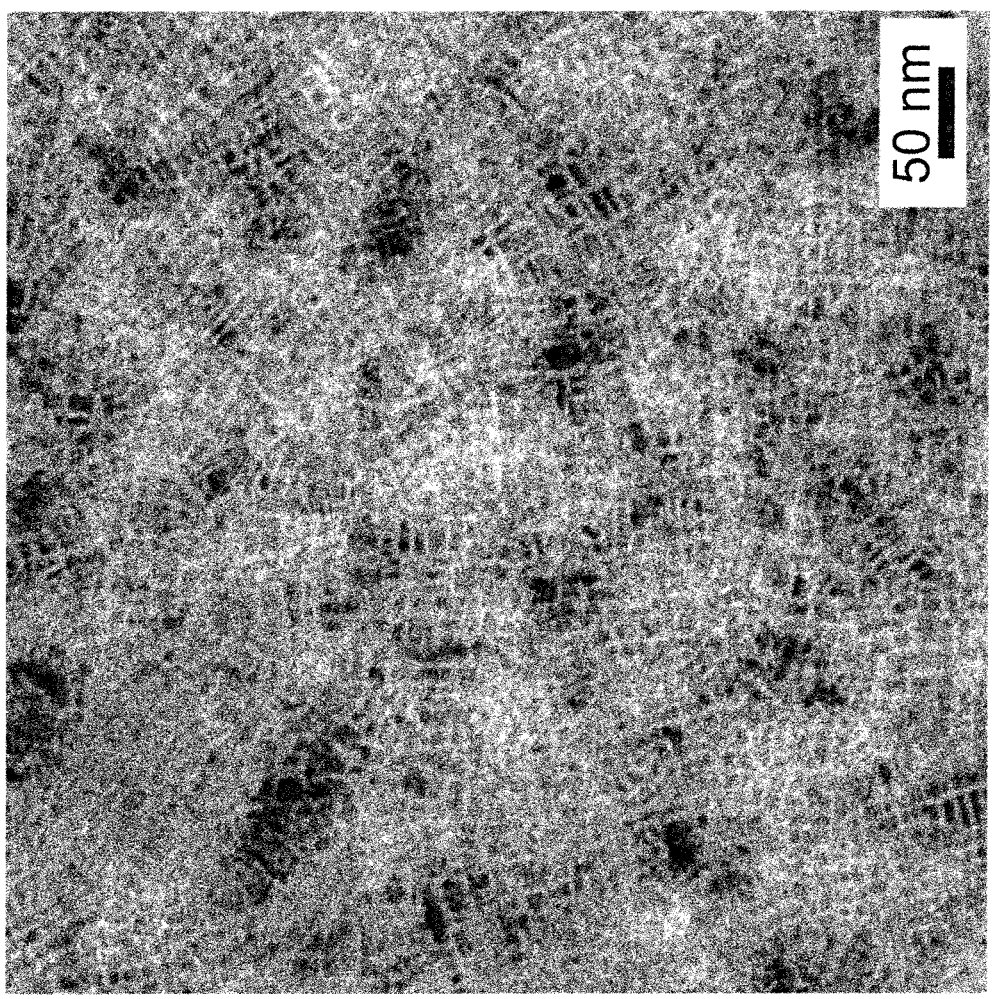
FIG. 12 shows a TEM image of $Cs_{0.85}FA_{0.15}PbBr_3$ luminescent crystals for a solid polymer composition according to an embodiment of the present invention.
Figure 13:
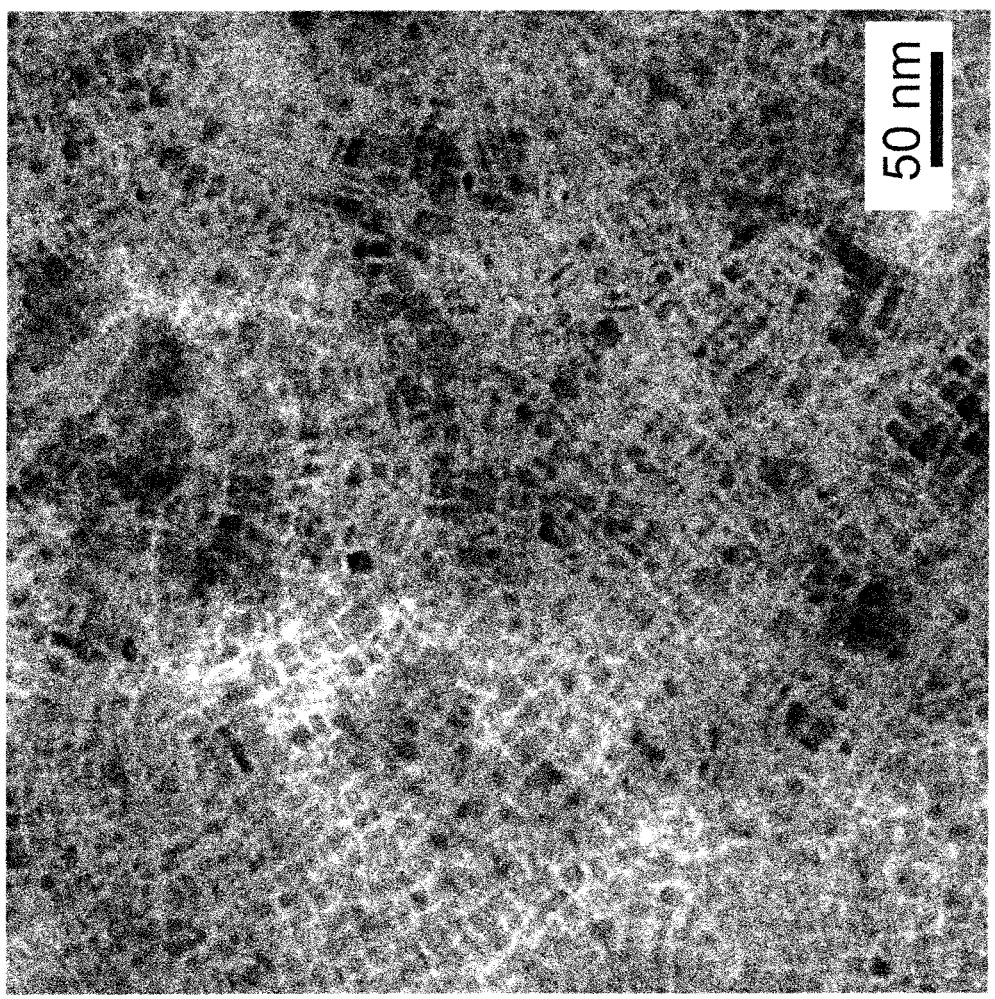
FIG. 13 shows a TEM image of $Cs_{0.5}FA_{0.5}PbBr_3$ luminescent crystals for a solid polymer composition according to an embodiment of the present invention.

TEM (transmission electron microscopy) images of inks from $FAPbBr_3$ (FIG. 11), $Cs_{0.85}FA_{0.15}PbBr_3$ (FIG. 12) and $Cs_{0.5}FA_{0.5}PbBr_3$ (FIG. 13) show LCs of size in the range of 5-50 nm.

Table 1 shows the optical properties of the ink and the film as initially obtained. Table 2 shows the properties of the film after degradation for 2 hours at 80° C. and ambient humidity (i.e. approximately 5% relative humidity) as well as after degradation for 2 hours at 60° C. at 90% relative humidity.

TABLE 1

| | Ink properties | | | Film properties | | |
|---|---|---|---|---|---|---|
| Composition | PLQY (%) | PP (nm) | FWHM (nm) | PLQY (%) | PP (nm) | FWHM (nm) |
| $CsPbBr_3$ | 42* | 507* | 40* | 90 | 514 | 23 |
| $Cs_{0.99}FA_{0.01}PbBr_3$ | 42* | 507* | 46* | 86 | 515 | 23 |
| $Cs_{0.95}FA_{0.05}PbBr_3$ | 38* | 506* | 48* | 80 | 514 | 25 |
| $Cs_{0.85}FA_{0.15}PbBr_3$ | 54* | 504* | 38* | 74 | 513 | 25 |
| $Cs_{0.5}FA_{0.5}PbBr_3$ | 58* | 496* | 50* | 74 | 510 | 27 |
| $Cs_{0.15}FA_{0.85}PbBr_3$ | 88* | 512* | 38* | 85 | 522 | 26 |
| $FAPbBr_3$ | 97* | 522* | 42* | 92 | 530 | 31 |

*measurement result might be biased because of dilution effects of the ink

TABLE 2

| | Degraded film properties 2 h 80° C. | | | Degraded film properties 2 h 60° C./90% RH | | |
|---|---|---|---|---|---|---|
| Composition | PLQY (%) | PP (nm) | FWHM (nm) | PLQY (%) | PP (nm) | FWHM (nm) |
| $CsPbEr_3$ | 68 | 515 | 24 | 60 | 515 | 22 |
| $Cs_{0.99}FA_{0.01}PbBr_3$ | 66 | 516 | 23 | 80 | 517 | 21 |
| $Cs_{0.95}FA_{0.05}PbBr_3$ | 58 | 515 | 25 | 68 | 517 | 22 |
| $Cs_{0.85}FA_{0.15}PbBr_3$ | 37 | 514 | 25 | 53 | 519 | 22 |
| $Cs_{0.5}FA_{0.5}PbBr_3$ | 29 | 512 | 25 | 66 | 512 | 26 |
| $Cs_{0.15}FA_{0.85}PbBr_3$ | 60 | 521 | 26 | 58 | 519 | 26 |
| $FAPbBr_3$ | 76 | 530 | 30 | 86 | 525 | 28 |

Conclusion: The data clearly show the high PLQY for both, ink and film. For films, this high PLQY is maintained even after stress-test under severe conditions.

Example 4

Luminescent Crystals of Composition $Cs_{0.15}FA_{0.85}PbBr_3$ emitting green light were used for the following experiment as described in example 3. The load of the solid polymer composition was measured to be 0.38 wt % by heating up to 450° C. and thus evaporating the solvent and burning away the surfactants.

The ink was mixed with a cyclic olefin copolymer solution in cyclohexane (4 wt % polymer in solvent) to yield a Pb concentration of 20,000 ppm. Spray drying in an inert loop (nitrogen) of the green polymer solution was used to obtain a powder exhibiting a particle size of 1-100 µm as confirmed by scanning electron microscopy. The resulting powder showed a quantum yield of 85%, peak position of 519 nm, and FWHM of 28 nm.

0.030 g of the green powder was mixed with an UV curable monomer (1.2 g Miramer SIU2400 with 3% wt initiator TPO-L, Rahn AG, Switzerland) in a speed mixer and the resulting mixture was cured between two glass slides (18×18 mm) for 60 s in UV (with a mercury lamp). This film sample showed a total quantum yield of 68%, a peak at 517 nm with FWHM of 29 nm.

The sample was subjected to a degradation test for 70 h with increased temperature in a drying oven (80° C., ambient humidity, i.e. approximately 5% relative humidity). The photoluminescence quantum yield of the sample after degradation was 71% with an emission peak centered at 514 nm. The FWHM was determined as 28 nm.

Conclusion: This example shows that the material as described in the present invention does not show pronounced degradation (drop of quantum yield, change of peak position or FWHM) when subjected to high temperature (80° C.) for 70 h.

Example 5

The luminescent crystal ink in cyclohexane of Example 1 emitting green light was used for the following experiment.

0.5 g of the ink was mixed with 1.5 g of isobornyl-acrylate (Sartomer), 100 mg Decane-diol-acrylate (Sartomer), 50 mg 2-Hydroxy-2-methylpropiophenone (Sigma Aldrich). This mixture was applied on a glass slide and the cyclohexane was dried-off for 5 min at 60° C. in air. Afterwards a second glass slide was put on top of the dried ink and the resin mixture was UV cured using a mercury lamp for 30 s.

The optical performance of the final cured film showed a quantum yield of 71%, a peak position at 528 nm, and a FWHM of 31 nm.

Conclusion: This result clearly shows that LC containing polymer compositions can be obtained starting from an acrylate monomer.

Example 6-11: Synthesis of Green Emitting LCs and Transfer into Different Solid Polymer Compositions $FAPbBr_3$ was obtained as described in Example 1. The orange $FAPbBr_3$ powder was added to (Lauryldimethylammonio)acetate (>95%, Sigma Aldrich), Oleylamine (80-90%, Acros) ($FAPbBr_3$: (Lauryldimethyl-ammonio)acetate:Oleylamine=1:0.1:0.3) and toluene (>99.7%, Fluka). The final nominal concentration of $FAPbBr_3$ was 1 wt %. The mixture was then dispersed by ball milling using Yttrium stabilized zirconia beads with a size of 200 microns at ambient conditions for a period of 1 h yielding an ink with green luminescence.

Analysis: Luminescence properties of the ink were recorded as presented in Example 1. The photoluminescence quantum yield (PLQY) of above ink was 88% with an emission peak centered at 528 nm (=peak position, PP). The FWHM of the emission was determined as 24 nm.

Film formation: The green emitting ink was then mixed with different polymers/pre-polymers. For acrylates 1 wt % Irgacure 184 as an initiator was mixed with the acrylate. The toluene from the acrylate/ink mixture was evaporated at room temperature by vacuum ($10^{-2}$ mbar) and the mixture was coated between two glass substrates with a thickness of 100 μm and cured with UV (Hoenle UVAcube 100, Hg lamp with quartz filter, 1 min). The glass slides were removed for further analysis and testing of the film. For cyclic olefin copolymer, polycarbonate (Makrolon OD2015), polystyrene (Mw=35,000, Sigma Aldrich), Poly(9-vinylcarbazole) (PVK, average Mn 25,000-50,000, Sigma Aldrich) and PVK: 2-(4-Biphenylyl)-5-phenyl-1,3,4-oxadiazole (PBD, Sigma Aldrich) mixtures (64 wt %:36 wt %) films were obtained as described in Example 1.

Analysis: Table 3 shows the optical properties of the film as initially obtained and after degradation for 20 hours at 80° C. and ambient humidity (i.e. approximately 5% relative humidity). The resulting optical properties of the film was measured with a spectrofluorimeter equipped with an integrating sphere (Quantaurus Absolute PL quantum yield measuring system C1134711, Hamamatsu).

TABLE 3

| Ex. # | Polymer | Initial film properties | | | Degraded film properties 20 h 80° C. | | |
|---|---|---|---|---|---|---|---|
| | | PLQY (%) | PP (nm) | FWHM (nm) | PLQY (%) | PP (nm) | FWHM (nm) |
| 6: | Acrylate* | 79 | 531 | 27 | 60 | 531 | 26 |
| 7: | Cyclic olefin copolymer | 83 | 531 | 24 | 57 | 531 | 24 |
| 8: | polycarbonate** | 86 | 525 | 27 | 63 | 528 | 29 |
| 9: | Polystyrene | 84 | 531 | 26 | 63 | 530 | 25 |
| 10: Comparative | Poly(9-vinylcarbazole) | 60 | 534 | 25 | 17 | 534 | 28 |
| 11: Comparative | PVK:PBD (64 wt %: 36 wt %) | 65 | 531 | 24 | 14 | 538 | 26 |

*Sartomer SR506D: Sartomer SR595 (95 wt %:5 wt %);
**Makrolon OD2015

Conclusion: These results show that LCs as described in this invention exhibit excellent initial properties and maintain high optical performance after accelerated degradation at 80° C. with acrylate, cyclic olefin copolymer, polycarbonate and polystyrene. The comparative examples with PVK and mixtures of PVK and PBD showed inferior initial optical properties and a significantly more pronounced degradation, rendering these polymers unsuitable for application in TVs or the like.

Example 13

A green luminescent crystal ink with $FAPbBr_3$ was prepared according to the procedure described in Example 1 but using toluene (>99.5%, puriss, Sigma Aldrich) as the solvent and (Lauryldimethylammonio acetate (>95%, Sigma Aldrich), Oleylamine (80-90%, Acros) ($FAPbBr_3$:(Lauryldimethylammonio) acetate:Oleylamine 1:0.1:0.3). The concentration of $FAPbBr_3$ was 1 wt %. Luminescent crystals emitting red light were produced as described by Protesescu et al. (Nano Lett., 2015, 15, 3692-3696). The resulting solids load was measured to be 0.53 wt % for red, by heating up to 350° C. and thus evaporating the solvent and burning away the ligands. The optical properties of the resulting nanocrystal formulation were measured with a Hamamatsu Quantaurus C11347-11 device (equipped with an integration sphere, 450 nm excitation) and a quantum yield of 90% at an emission peak wavelength of 645 nm with a FWHM of 38 nm for red was achieved. This nanocrystal formulation was mixed with a cyclic olefin copolymer solution in toluene (20 wt % polymer in solvent) to yield a polymer:nanocrystal ratio of 20:1 and subsequently diluted with toluene to a final polymer content in the formulation of 4 wt %. Spray drying in an inert loop (nitrogen) of the red polymer solution was used to obtain a powder exhibiting a particle size of 1-20 μm as confirmed by scanning electron microscopy. The red powder showed a quantum yield of 87%, peak position of 647 nm, and FWHM of 38 nm.

0.6 g of the green ink was mixed with 4.0 g of isobornyl-acrylate (SR506D, Sartomer):Decane-diol-diacrylate (SR595, Sartomer) in a weight ratio of 95:5 and 40 mg Irgacure 184 (Ciba). The toluene was evaporated in vacuum ($10^{-2}$ mbar) at room temperature. 0.02 g of the red powder was added and homogenized in a speed mixer. The final mixture was applied between two glass slides and the resin mixture was UV cured using a mercury lamp for 60 s.

The optical performance of the final cured film showed a quantum yield of 68%, a peak position at 528 nm, and a FWHM of 24 nm for green and 643 nm and 38 nm for red, respectively.

Conclusion: This result confirms that LC polymer compositions containing one fraction of LCs in an element dispersed within an encapsulation polymer containing the second fraction of LCs can be obtained by the present invention.

Example 14

A green luminescent crystal ink with FAPbBr$_3$ was prepared according to the procedure described in Example 13. The ink was roughly 10 times concentrated by evaporation at 50° C. and 130 mbar. The resulting solids load was measured to be 4.5 wt %, by heating up to 350° C. and thus evaporating the solvent and burning away the ligands. The photoluminescence quantum yield (PLQY) of above concentrated ink was 84% with an emission peak centered at 525 nm. The FWHM of the emission was determined as 25 nm. 2.8 g concentrate was then mixed with 1 g of an acrylate (Sartomer SR506D:Sartomer SR595, 95 wt %:5 wt %) and 1 wt % Irgacure 184 as an initiator. The mixture was coated on a glass substrates dried at room temperature and cured with UV (Hoenle UVAcube 100, Hg lamp with quartz filter, 1 min). The film thickness was 4.5 μm measured by atomic force microscopy and the LC weight per area was 0.5 g/m² exhibiting a PLQY of 80% a PP of 533 nm and a FWHM of 25 nm. The leakage of blue light through this film was measured by placing it in front of the blue Samsung SUHD TV backlight (Model UE48JS8580T). The resulting spectra was recorded with a spectrometer (UPRtek, MK350N) and a ratio of green peak:blue peak of 1:0.1 was recorded, indicating that most of the blue light was absorbed.

Conclusion: This result confirms that LC polymer compositions obtained by the present invention; with a certain LC weight loading per area of film allow for absorption of most of a commercial TV set blue light and the transformation of this blue light into another color with larger wavelength.

Example 15: Synthesis Using Alternative Surfactants, Solvents

Step (a): Formamidinium lead tribromide (FAPbBr$_3$) was synthesized as described above.

Step (b): The following further experiments were all conducted by ball milling using similar process parameters (LCs/QDs:total surfactant ratio=2:1, milling bead size=200 microns, milling time=60 min, LCs/QDs concentration in the ink=1%, filtered by 0.45 um PTFE syringe filter for optical characterization, optical characterization was identical as in Example 1):

| Solid Ex. # | material | Surfactant | solvent | Peak emission/ FWHM/QY |
|---|---|---|---|---|
| 15-1 | FAPbBr$_3$ | (N,N-dimethyl-octadecylammonio) propane sulfonate | cyclohexane | yellow-green, 534 nm/23 nm/ 91% |
| 15-2 | FAPbBr$_3$ | N-Oleoyl-gamma-aminobutyric acid | cyclohexane | Green, NA/NA/ NA |
| 15-3 | FAPbBr$_3$ | Oleylammonium bromide | toluene | Green, 518 nm/ 26 nm/76% |
| 15-4 | FAPbBr$_3$ | N-Dodecyl-N,N-(di-methylammonio)butyrate (zwitterionic carboxylate) | toluene | Green/NA/ NA/NA |
| 15-5 | FAPbBr$_3$ | N-Dodecyl-N,N-(di-methylammonio)butyrate (zwitterionic carboxylate):Oleylamine 1:2 | toluene | Green/532 nm/ 21 nm/86% |
| 15-6 | FAPbBr$_3$ | Hexadecyl phosphocholine (zwitterionic phosphonate) | toluene | Green/537 nm/ 26 nm/40% |

Above suspensions are also suited for incorporation in a solid polymer composition as outlined in previous examples.

Conclusion: These example shows the effectiveness of the invention using different surfactant classes and solvents.

The invention claimed is:
1. A solid polymer composition comprising:
(i) luminescent crystals of 3-500 nm size, said luminescent crystals being selected from compounds of formula (I)

$$[M^1A^1]_a M^2_b X_c \qquad \text{(I), wherein:}$$

cation $A^1$, which is mandatory, is an organic cation, cation $M^2$ is a metal cation and cation $M^1$, if present, is an alkali metal cation; and $A^1$ represents one or more cations selected from the group consisting of ammonium, formamidinium, guanidinium, imidazolium, pyridinium, pyrrolidinium, protonated thiourea, $M^1$ represents one or more alkaline metals selected from Cs, Rb, K, Na, Li, $M^2$ represents one or more metals selected from the group consisting of Ge, Sn, Pb, Sb, and Bi, X represents one or more anions selected from the group consisting of chloride, bromide, iodide, cyanide, thiocyanate, isothiocyanate and sulfide, a represents 1-4, b represents 1-2, c represents 3-9; and (ii) a surfactant selected from the group of non-ionic, anionic, cationic and zwitter-ionic surfactants, and (iii) a hardened/cured polymer, said polymer being an acrylate comprising or consisting of units of formula (III):

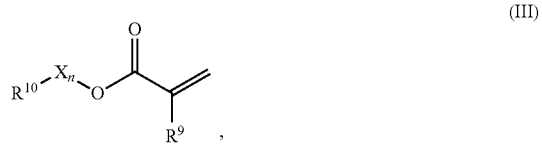

wherein:

$R^9$ represents H or CH$_3$, $R^{10}$ represents a cyclic $C_{5-25}$ alkyl, or a cyclic $C_{5-25}$ alkenyl group, or a $C_{6-26}$ aryl group, each optionally substituted with one or more cyclic, linear or branched $C_{1-20}$ alkyl, phenyl or phenoxy, n represents 0 or 1, and X represents a spacer from the group of alkoxylates comprising 1-40 carbon atoms and 1-10 oxygen atoms.

2. The solid polymer composition according to claim 1, wherein
the weight ratio of luminescent crystals:matrix (polymer+surfactant) is in the range of 0.00001-0.2; and/or
the weight ratio surfactant:luminescent crystals is in the range of 100-0.01.

3. The solid polymer composition according to claim 1, wherein in formula (I) of the luminescent crystals $A^1$ represents formamidinium, and $M^1$ is not present.

4. The solid polymer composition according to claim 1, wherein the surfactant is a zwitter-ionic surfactant.

5. A luminescent component, comprising
a first element comprising a first solid polymer composition according to claim 1,
wherein luminescent crystals of the first solid polymer composition emit light of a first wavelength in response to excitation by light with a wavelength shorter than the first wavelength, and
an encapsulation enclosing the first element, wherein the encapsulation comprises an encapsulation polymer or inorganic matrix.

6. The luminescent component according to claim 5, further comprising
a second element comprising a second solid polymer composition comprising (i) luminescent crystals of 3-500 nm size, said luminescent crystals being selected from compounds of formula (I); (ii) a second surfactant; and a second a hardened/cured polymer,
wherein luminescent crystals of the second solid polymer composition
are of a different chemical composition and/or a different size than the luminescent crystals of the first solid polymer composition,
emit light of a second wavelength different to the first wavelength in response to excitation by light with a wavelength shorter than each of the first and second wavelength,
wherein the encapsulation encloses the second element.

7. The luminescent component according to claim 6, comprising
N further elements with N≥1, each further element comprising a further solid polymer composition comprising (i) luminescent crystals of 3-500 nm size, said luminescent crystals being selected from compounds of formula (I); (ii) a further surfactant; and a further hardened/cured polymer wherein the luminescent crystals of the further solid polymer composition
are of a different chemical composition and/or a different size than the luminescent crystals of the first solid polymer composition, the luminescent crystals of the second solid polymer composition, and any luminescent crystals of the N−1 other solid polymer compositions,
emit light of a further wavelength in response to excitation by light with a wavelength shorter than the further wavelength, wherein the further wavelength is different from the first wavelength, is different from the second wavelength, and is different from any of the N−1 other further wavelengths.

8. The luminescent component according to claim 6, wherein the first element and the second element are arranged spaced within the encapsulation.

9. The luminescent component of claim 7, wherein the polymer of the further solid polymer composition is not dissolvable in the encapsulation polymer or inorganic matrix, and vice versa.

10. The luminescent component according to claim 6, wherein the luminescent crystals of the first solid polymer composition, and the luminescent crystals of the second solid polymer composition, independently are of size between 3 nm and 100 nm.

11. The luminescent component of claim 6, wherein the polymer of the second solid polymer composition is not dissolvable in the encapsulation polymer or inorganic matrix, and vice versa.

12. The luminescent component according to claim 5, wherein the encapsulation polymer is a polymer selected from the list of acrylate polymers, carbonate polymers, sulfone polymers, epoxy polymers, vinyl polymers, urethane polymers, ester polymers, styrene polymers, silicone polymers, olefin polymers, cyclic olefin copolymers, and halogenated vinyl polymers.

13. The luminescent component of claim 12, wherein the encapsulation polymer has a water vapor permeability of less than 5 g mm m$^{-2}$ day$^{-1}$.

14. The luminescent component according to claim 5, wherein the encapsulation comprises luminescent crystals according to formula (I).

15. The luminescent component according to claim 14, wherein the luminescent crystals comprised in the encapsulation are of different chemical composition and/or size than the luminescent crystals of the first solid polymer composition and emit light of a wavelength different to the first wavelength in response to excitation by light with a wavelength shorter than the first wavelength.

16. The luminescent component according to claim 5, comprising
one or more barrier films each having a water vapor transmission rate of less than 0.1 g m$^{-2}$ day$^{-1}$.

17. The luminescent component of claim 16, wherein a material of each barrier film is selected from the group consisting of polyvinylidene chlorides, cyclic olefin copolymers, high-density polyethylene, metal oxides, silicon oxide, silicon nitride; optionally in the form of organic/inorganic multilayers.

18. The luminescent component of claim 5, wherein the polymer of the first solid polymer composition is not dissolvable in the encapsulation polymer or inorganic matrix, and vice versa.

19. A luminescent component, comprising
a first film comprising a first solid polymer composition according to claim 1,
wherein the luminescent crystals of the first solid polymer composition emit light with a first wavelength in response to excitation by light with a wavelength shorter than the first wavelength.

20. The luminescent component according to claim 19, wherein the luminescent crystals of the first solid polymer composition emit red light in response to excitation by light with a shorter wavelength,
comprising a second film, comprising a second solid polymer composition comprising (i) luminescent crystals of 3-500 nm size, said luminescent crystals being selected from compounds of formula (I); (ii) a second surfactant; and a second a hardened/cured polymer wherein the luminescent crystals of the second solid polymer composition emit green light in response to excitation by light with a shorter wavelength.

21. The luminescent component according to claim 20, wherein a thickness of the first film is between 3 μm and 500 μm and/or wherein a thickness of the second film is between 30 μm and 500 μm.

22. The luminescent component according to claim 20, further comprising a substrate and at least one barrier film having a water vapor transmission rate of less than 0.1 g m$^{-2}$ day$^{-1}$,
wherein one of the first and the second film is arranged between the substrate and the other of the first and the second film, and
wherein the first and the second film are arranged between the substrate and the at least one barrier film.

23. The luminescent component according to claim 20, comprising
a substrate,
wherein the first film is supported by the substrate, and
wherein the second film is supported by the substrate, and
wherein the substrate is one of an organic substrate or an inorganic substrate.

24. The luminescent component according to claim 23, further comprising at least a first and a second barrier film each having a water vapor transmission rate of less than 0.1 g m$^{-2}$ day$^{-1}$,
wherein the substrate is arranged between the first film and the second film, and
wherein the first film is arranged between a first of the barrier films and the substrate, and the second film is arranged between a second of the barrier films and the substrate.

25. The luminescent component according to claim 23, further comprising at least one barrier film having a water vapor transmission rate of less than 0.1 g m$^{-2}$ day$^{-1}$,
wherein the first film and the second film are arranged on a common surface of the substrate,
wherein the first film and the second film are arranged spaced or adjacent, and
wherein the first film and the second film are arranged between the substrate and the at least one barrier film.

26. The luminescent component according to claim 25, comprising
multiple first films of the first solid polymer composition,
multiple second films of the second solid polymer composition,
wherein the multiple first films and the multiple second films are arranged on the common surface of the substrate, and
wherein the multiple first films and the multiple second films are arranged between the substrate and the at least one barrier film.

27. The luminescent component according to claim 26, wherein the multiple first films and the multiple second films are arranged alternating on the common surface of the substrate in one of a spaced or an adjacent arrangement.

28. The luminescent component according to claim 19, wherein the luminescent crystal weight per area of film is between 0.05 g/m$^2$ and 3.0 g/m$^2$.

29. The luminescent component according to claim 19, comprising one or more barrier films each having a water vapor transmission rate of less than 0.1 g m$^{-2}$ day$^{-1}$.

30. The luminescent component of claim 29, wherein a material of each barrier film is selected from the group consisting of polyvinylidene chlorides, cyclic olefin copolymers, high-density polyethylene, metal oxides, silicon oxide, silicon nitride; optionally in the form of organic/inorganic multilayers.

31. A light emitting device, comprising
a luminescent component according to claim 5,
a light source for emitting blue light,
wherein the light source is arranged for exciting the luminescent component, and
wherein the light emitting device is one of a Liquid Crystal Display, an Organic Light Emitting Diode or a Light Emitting Diode.

* * * * *